United States Patent
Qiu et al.

(10) Patent No.: US 9,929,718 B1
(45) Date of Patent: Mar. 27, 2018

(54) TUNABLE FILM BULK ACOUSTIC RESONATORS AND FILTERS WITH INTEGRATED BIASING RESISTORS

(71) Applicants: Cindy X. Qiu, Brossard (CA); Ishiang Shih, Brossard (CA); Chunong Qiu, Brossard (CA); Andy Shih, Brossard (CA); Julia Qiu, Brossard (CA); Yi-Chi Shih, Los Angeles, CA (US)

(72) Inventors: Cindy X. Qiu, Brossard (CA); Ishiang Shih, Brossard (CA); Chunong Qiu, Brossard (CA); Andy Shih, Brossard (CA); Julia Qiu, Brossard (CA); Yi-Chi Shih, Los Angeles, CA (US)

( * ) Notice: Subject to any disclaimer, the term of this patent is extended or adjusted under 35 U.S.C. 154(b) by 74 days.

(21) Appl. No.: 15/330,313

(22) Filed: Sep. 6, 2016

(51) Int. Cl.
| | |
|---|---|
| *H03H 9/00* | (2006.01) |
| *H03H 9/54* | (2006.01) |
| *H01L 41/187* | (2006.01) |
| *H03H 9/17* | (2006.01) |
| *H01L 41/047* | (2006.01) |
| *C01B 21/072* | (2006.01) |
| *C01B 21/06* | (2006.01) |
| *C01G 9/02* | (2006.01) |
| *C01G 33/00* | (2006.01) |
| *C01G 23/00* | (2006.01) |

(52) U.S. Cl.
CPC ......... *H03H 9/542* (2013.01); *C01B 21/0602* (2013.01); *C01B 21/0632* (2013.01); *C01B 21/072* (2013.01); *C01G 9/02* (2013.01); *C01G 23/003* (2013.01); *C01G 23/006* (2013.01); *C01G 33/006* (2013.01); *H01L 41/047* (2013.01); *H01L 41/187* (2013.01); *H01L 41/1871* (2013.01); *H01L 41/1873* (2013.01); *H01L 41/1876* (2013.01); *H03H 9/171* (2013.01); *C01P 2006/40* (2013.01)

(58) Field of Classification Search
CPC ........ H03H 9/00; H03H 9/54; H01L 41/0457; H01L 41/187
USPC .......................................... 333/133, 187–192
See application file for complete search history.

(56) References Cited

U.S. PATENT DOCUMENTS

| | | | | |
|---|---|---|---|---|
| 5,166,646 A | * | 11/1992 | Avanic | H03B 5/326 257/312 |
| 7,372,346 B2 | * | 5/2008 | Tilmans | H03H 9/02102 333/187 |
| 8,925,163 B2 | * | 1/2015 | Meltaus | H03H 3/02 29/25.35 |
| 2017/0025596 A1 | * | 1/2017 | Qiu | H01P 1/201 |

* cited by examiner

Primary Examiner — Dean Takaoka

(57) ABSTRACT

In wireless communications, many radio frequency bands are used. For each frequency band, there are two frequencies one for transmit and the other for receive. As the band widths are small and separation between adjacent bands is also small, many band pass filters with different band pass frequencies are required for each communication unit such as mobile handset. The present invention provides frequency tunable film bulk acoustic resonators (FBAR) with different structures. Thin film biasing resistors are integrated into the FBAR structure for DC biasing and RF isolation. A plurality of the present tunable FBARs are connected to form microwave filters with tunable bandpass frequencies and oscillators with selectable resonating frequencies by varying DC biasing voltages to the resonators.

21 Claims, 7 Drawing Sheets

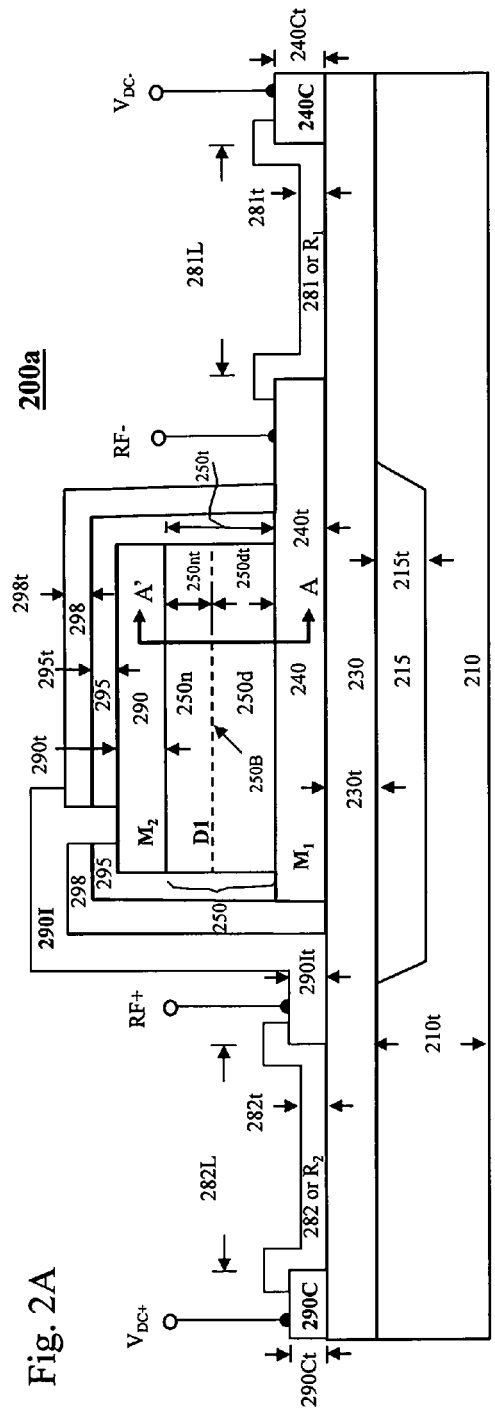

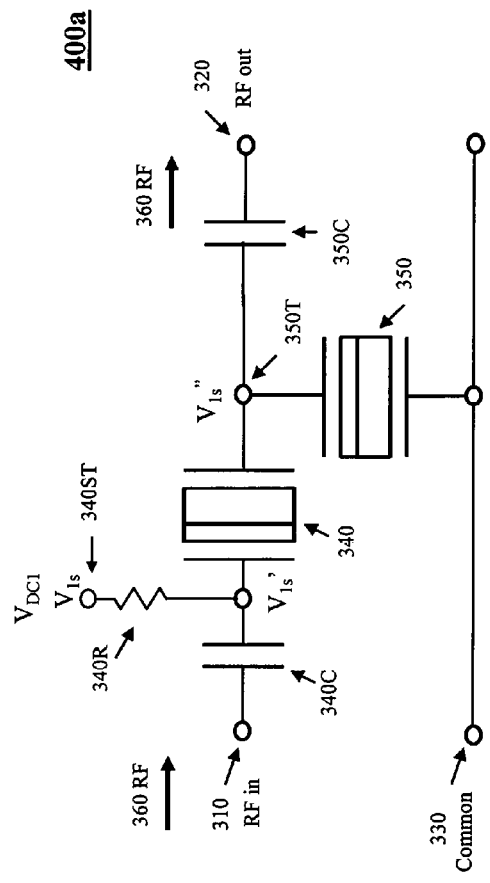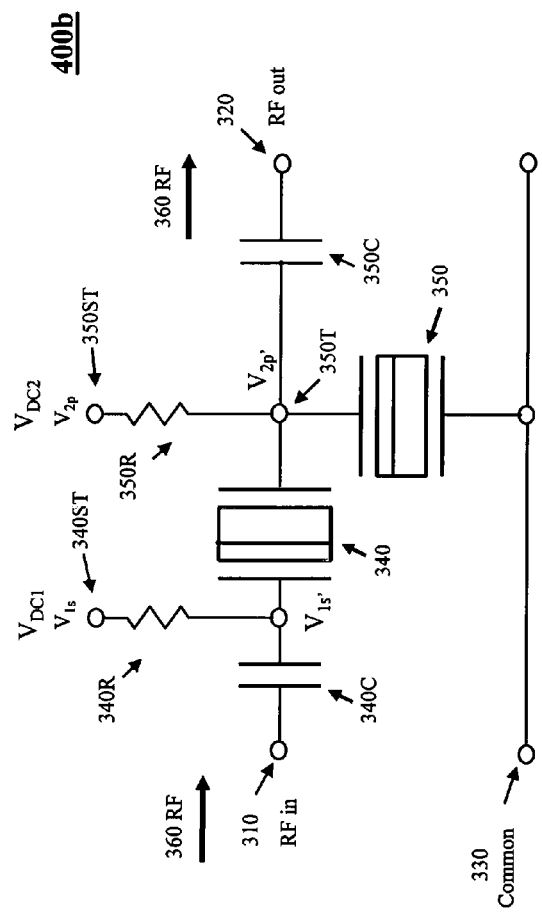
Fig. 4A
Fig. 4B

US 9,929,718 B1

TUNABLE FILM BULK ACOUSTIC RESONATORS AND FILTERS WITH INTEGRATED BIASING RESISTORS

FIELD OF THE INVENTION

This invention relates to resonators and filters with tunable and tunable and adjustable frequency for communication systems. More specifically, it relates to tunable and adjustable piezoelectric semiconductor resonators and filters with integrated biasing resistor for RF isolation.

BACKGROUND OF THE INVENTION

Communication systems that operate at radio frequencies (RF) require small and low cost bandpass filters. These bandpass filters are used to select transmit or receive signals within a certain band width BW at a specified frequency and to reject signals at frequencies outside the band width. Some examples include global positioning systems GPS, mobile telecommunication systems: Global Systems for Mobile Communications GSM, personal communication service PCS, the Universal Mobile Telecommunications System UMTS, Long Term Evolution Technology LTE, data transfer units: Bluetooth, Wireless Local Area Network WLAN, satellite broadcasting and future traffic control communications. They also include other high frequency systems for high rate data transmission/acquisition in air and space vehicles.

Bandpass filters for RF signal filtering are fabricated using different technologies: (a) ceramic filters based on dielectric resonators, (b) filters using surface acoustic wave resonators (SAW), and (c) filters using thin film bulk acoustic wave resonators (FBAR). For mobile communication systems such as handsets, although the power capability required for the RF filters is only 5 W or less, the size and cost requirements are rather critical. The main properties of piezoelectric materials for filters are acoustic wave propagation velocity and coupling coefficient. The velocity determines the resonant frequency with electrode pitch and the coupling coefficients affect the band width. For FBARs, the main properties are velocity of acoustic waves and thickness of active piezoelectric layer.

FIG. 1A shows a schematic cross-sectional diagram of a prior art film bulk acoustic resonator FBAR (100a) on a substrate (110) with a substrate thickness (110t). It comprises an air cavity (115) having an air cavity depth (115t), a bottom electrode (140) with a bottom electrode thickness (140t), a piezoelectric layer (150) having a piezoelectric layer thickness (150t) and a top electrode (190) with a top electrode thickness (190t). The purpose of the air cavity (115) is to prevent the acoustic waves from getting into the substrate. Therefore, the acoustic energy is confined in the piezoelectric layer (150) with a minimum loss into the substrate (110). The resonant frequency of the FBAR (100a) is mainly determined by the piezoelectric layer thickness (150t). On the other hand, due to the presence of the air cavity (115), the dissipation of heat generated in the piezoelectric layer (150), the bottom metal electrode layer (140) and the top metal electrode layer (190) to the substrate (110) of the FBAR is limited. Hence, in order to prevent circuits instability due to excessive heating of the piezoelectric layer (150), the operating power of systems involving FBARs with an air cavity (115) cannot be too high. In the prior art FBAR shown in FIG. 1A, the piezoelectric layer (150) is responsible for the interactions between the acoustic waves and the RF electric field to be applied between the top electrode layer (190) and bottom electrode layer (140). Because the piezoelectric layer (150) has a constant thickness (150t), the acoustic waves resonant frequency are fixed.

In order to improve dissipation of heat from the piezoelectric layer, another structure of FBAR has been adopted and used in RF filters. FIG. 1B shows a schematic cross-sectional diagram of another prior art FBAR (100b) named solidly mounted bulk acoustic resonator (SMBAR or SMR). The SMBAR (100b) is deposited on the substrate (110) with a substrate thickness (110t), having a thin film reflector stack (120) having alternating low impedance layers (120-L1, 120-L2, 120-L3) and high impedance layers (120-H1, 120-H2) with a total thin film reflector stack thickness (120Tt), a bottom electrode (140) with a bottom electrode thickness (140t), a piezoelectric layer (150) with a piezoelectric layer thickness (150t), a top electrode (190) with a top electrode thickness (190t). The resonant frequency $f_o$ is determined by the velocity v of the acoustic waves and the piezoelectric layer thickness (150t). To confine the acoustic wave energy in the piezoelectric layers and to minimize loss to the substrate (110), low impedance layer thickness (120-Lt) and high impedance layer thickness (120-Ht) are selected to be $\lambda/4$, here $\lambda$ is the wavelength of the acoustic wave in the respective layer. As there is no air gap between the piezoelectric layer (150) and the substrate (110), the dissipation rate of heat generated in the piezoelectric layer (150) and electrode layers (140, 190) to the substrate (110) is greater than that of the FBAR (100a) with an air cavity (115) as shown in FIG. 1a. In the prior art FBAR (100b), the piezoelectric layer (150) is the active layer responsible for the interactions between RF electric field to be applied between the top electrode layer (190) and the bottom electrode layer (140) and the acoustic waves. Because the thickness of the piezoelectric layer is constant, the resonant frequency of acoustic waves is fixed. Therefore, once a filter involving FBARs has been fabricated, the central frequency $f_o$ of transmission and bandwidth BW are fixed by the geometry and materials used.

Due to the large number of bands used in the mobile handsets in different regions and countries, and even in the same country, a practical handset needs to have an RF front end covering several frequency bands. A true world phone will need to have about 40 bands, each with a transmit band and receive band. As each RF filter has only one central frequency of resonant and a fixed bandwidth, therefore, such a true world phone will need to have 80 filters for the front end. Due to the resource limitations, some designers design mobile phone handsets to cover 5 to 10 bands for selected regions or countries. Even with this reduced number of bands, the number of RF filters currently required is still large: from 10 to 20 units. Therefore, there is a strong need to reduce the dimensions and cost of the RF filters. It would be ideal to reduce the number of filters by having tunable RF filters, each to cover at least two frequency bands. If this is successful, the number of filters can be reduced in the mobile handsets and many other microwave and wireless systems. Thus, it would be critical to develop an RF filter which can cover as many bands or frequency ranges as possible so that the size and power consumption of RF front ends in a mobile phone handset and microwave systems can be reduced.

BRIEF SUMMARY OF THE INVENTION

One object of the invention is to provide a $M_1D_1M_2$ or a MDM FBAR structure with integrated biasing resistors for forming a microwave acoustic filter, an oscillator and a switch, with the central frequency of resonant adjustable and tunable by the application of a first DC voltage through the integrated biasing resistors for the construction of wireless or microwave systems.

One other object of the invention is to provide a $M_1I_1D_2M_2$ or a MIDM FBAR structure with integrated biasing resistors for forming a microwave acoustic filter, an oscillator and a switch, with the central frequency of resonant adjustable and tunable by the application of a first DC voltage through the integrated biasing resistors for the construction of wireless or microwave systems.

Another object of the invention is to provide a $M_1D_1D_2M_2$ or a MDDM FBAR structure with integrated biasing resistors for forming a microwave acoustic filter, an oscillator and a switch, with the central frequency of resonant adjustable and tunable by the application of a first DC voltage through the integrated biasing resistors for the construction of wireless or microwave systems.

Yet another object of the invention is to provide a $M_1D_1I_1D_2M_2$ or a MDIDM FBAR structure with integrated biasing resistors for forming a microwave acoustic filter, an oscillator and a switch, with the central frequency of resonant adjustable and tunable by the application of a first DC voltage through the integrated biasing resistors for the construction of wireless or microwave systems.

Still another object of this invention is to provide a tunable filter with a plurality of tunable series resonators, a plurality of tunable parallel resonators, a plurality of coupling capacitors, a plurality of isolation resistors and with a first DC voltage source to control and select resonant frequencies of the resonators and to tune and control the transmission central frequency in the tunable filter.

Yet still another object of this invention is to provide a tunable filter with a plurality of tunable series resonators, a plurality of tunable parallel resonators, a plurality of coupling capacitors, a plurality of isolation resistors and with a first DC voltage source and a second DC voltage source to control and select resonant frequencies of the resonators and to tune and control the transmission central frequency in the tunable filter.

BRIEF DESCRIPTION OF THE SEVERAL VIEWS OF THE DRAWING

FIG. 2A is a schematic cross-sectional diagram of a frequency tunable $M_1D_1M_2$ FBAR (200a) with integrated biasing resistors according to this invention. The MDM FBAR structure comprises a substrate, an acoustic wave isolation region, a bottom support membrane, a first metal electrode ($M_1$), a first piezoelectric semiconductor layer ($D_1$) with a first piezoelectric depletion region forming a piezoelectric active region and a second metal electrode ($M_2$).

FIG. 2B shows thin film biasing resistors (281 or 282) having rectangular shapes, with a length (281L or 282L), a width (281W or 282W) and a thickness (281T or 282T).

FIG. 2C shows variation of electric field $\xi(x)$ with distance along a line A-A' in the MDM structure shown in FIG. 2A with a DC biasing voltage applied between the first metal electrode and the second metal electrode for frequency tuning. A change in the DC biasing voltage $\Delta V_{DC}$ causes a change in the electric field $\Delta \xi_o$ in the first piezoelectric semiconductor layer ($D_1$) and a change in the depletion region thickness $\Delta W_n$ and hence a change in the resonant frequency of the MDM FBAR.

FIG. 4A shows a schematic diagram of a tunable microwave filter circuit (400a) formed by connecting two FBAR resonators (340, 350) according to this invention. The filter circuit comprises a first series resonator, a second parallel resonator, a first coupling capacitor, a second coupling capacitor and a first isolation resistor. A first DC voltage source $V_{DC1}$ is used to establish biasing in the first series resonator and in the second parallel resonator and to control the central frequency of resonant $f_{o1}$ of the filter (400a).

FIG. 4B shows a schematic diagram of a tunable microwave filter circuit (400b) formed by connecting two FBAR resonators (340, 350) according to this invention. It comprises a first series resonator, a second parallel resonator, a first coupling capacitor, a second coupling capacitor, a first isolation resistor, a second isolation resistor. A first DC voltage source $V_{DC1}$ and a second DC voltage source $V_{DC2}$, are applied to establish biasing to the resonators and to control the central frequency of the filter.

DETAILED DESCRIPTION OF THE INVENTION

Figure 1B:
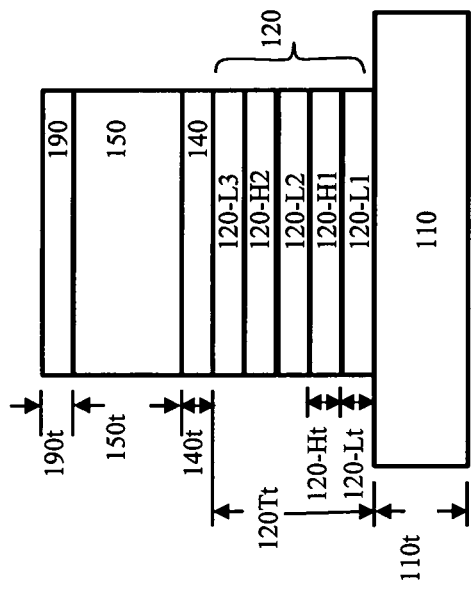
FIG. 1B is a schematic cross-sectional diagram showing a prior art FBAR solidly mounted bulk acoustic resonator (100b) on a bottom substrate (110), having a thin film reflector stack (120) with low impedance layers (120-L1, 120-L2, 120-L3) and high impedance layers (120-H1, 120-H2), a bottom electrode (140), a piezoelectric layer (150), and a top electrode (190). The resonant frequency $f_o$ of the prior art FBAR is determined by the velocity of acoustic waves v and the piezoelectric layer thickness (150t) and is fixed.
Figure 1A:
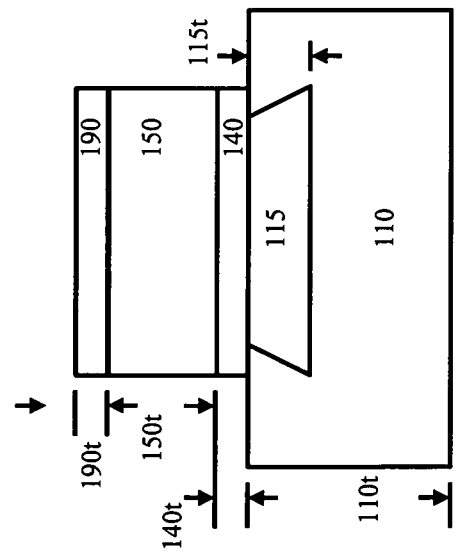
FIG. 1A is a schematic cross-sectional diagram showing a prior art film bulk acoustic resonator FBAR (100a) with a fixed resonant frequency which comprises a bottom substrate (110), an air cavity (115), a bottom electrode (140), a piezoelectric layer (150) and a top electrode (190).

An $M_1D_1M_2$ FBAR Structure with Integrated Biasing Resistors

FIG. 2A shows a schematic diagram of a portion of an $M_1D_1M_2$ FBAR or an MDM FBAR structure (200a) with integrated biasing resistors according to one embodiment of this invention. Here, $M_1$ is a first metal electrode, $D_1$ is a doped first piezoelectric semiconductor layer and $M_2$ is a second metal electrode. The MDM FBAR structure comprises a bottom substrate (210) with a bottom substrate thickness (210t); an acoustic isolation region (215) having an acoustic isolation region thickness (215t); a bottom support membrane (230) with a bottom support membrane thickness (230t); a first metal electrode $M_1$ (240) having a first metal electrode thickness (240t); a first metal electrode contact (240C) having a first metal electrode contact thickness (240Ct) connected to a negative terminal of a DC biasing voltage source; a first piezoelectric semiconductor layer (250) with a first piezoelectric layer thickness (250t), a first piezoelectric layer doping type (p-type or n-type but preferably n-type) and a first piezoelectric layer doping concentration ($N_D$ for n-type); a second metal electrode (290) having a second metal electrode thickness (290t); a second metal electrode contact (290C) having a second metal electrode contact thickness (290Ct) connected to a positive terminal of the DC biasing voltage source; a first passivation layer (298) with a first passivation layer thickness (298t); a first temperature compensation layer (295) with a first temperature compensation layer thickness (295t) to improve thermal stability of the FBAR (200a) and a second metal electrode interconnect (290I) with a second metal electrode interconnect thickness (290It), wherein the second metal electrode interconnect (290I) is electrically connected to the second metal electrode (290) through an opening in the first passivation layer (298) and the first temperature compensation layer (295). The acoustic isolation region (215) may be an air cavity or a multi layer reflector having a plurality of reflector layers, for acoustic wave isolation, according to this invention.

The first piezoelectric semiconductor layer (250) is separated by a first piezoelectric depletion region edge (250B) into two regions: a first piezoelectric depletion region (250d) with a first piezoelectric depletion region thickness (250dt) and a first piezoelectric neutral region (250n) with a first piezoelectric neutral region thickness (250nt). The first piezoelectric neutral region (250n) is electrically conducting with a conductivity approximately proportional to the doping concentration of the first piezoelectric semiconductor layer (250) and the first piezoelectric depletion region (250d) is intrinsic and electrically insulating due to a low free carrier density. In this MDM FBAR, the depletion region constitutes a piezoelectric active layer to allow interactions between the RF signals and the acoustic signals to take place.

When the loading effect and thickness effect of the electrodes are ignored, the resonant frequency $f_o$ is determined by the acoustic wave velocity v in the piezoelectric depletion region and the thickness t of the piezoelectric depletion region so that: $f_o = v/(2t)$. Since the interactions between the RF signals and acoustic signals take place mainly in the piezoelectric active layer (namely the first piezoelectric depletion region), they are affected by the thickness of the piezoelectric active layer (i.e. the first piezoelectric depletion region thickness). Because the thickness (250dt) of the piezoelectric depletion region (250d) is adjustable by varying the DC biasing voltage applied between the first metal electrode (240) and the second metal electrode (290), therefore, the resonant properties and frequencies of the MDM FBAR structure and any filters, switches or other devices based on the semiconducting piezoelectric layers microwave acoustic effect can be tuned and adjusted by changing the polarity and/or the magnitude of the DC voltage according to this invention.

A first biasing resistor (281) with a first biasing resistor resistance value $R_1$ and a second biasing resistor (282) with a second biasing resistor resistance value $R_2$ are integrated with the MDM FBAR for providing a DC bias voltage and an isolation between the RF signal and the DC biasing circuit. The first biasing resistor (281) and the second biasing resistor (282) are preferably integrated thin film resistors and may have different shapes such as rectangle, zig-zag, square, oval, triangle, trapezium, diamond, rhombus and parallelogram. When the first biasing resistor (281) is preferably selected to have a rectangular shape for simplicity, as shown in FIG. 2B, it has a first biasing resistor length $R_{1L}$ (281L), a first biasing resistor width $R_{1W}$ (281W), a first biasing resistor thickness $R_{1T}$ (281T) and a first biasing resistor sheet resistance $R_{\square 1}$. In FIG. 2A, the first biasing resistor (281) connects the first metal electrode (240) to the first metal electrode contact (240C), for providing a potential $V_{DC-}$, through (240C) and (281) to the first metal electrode (240 or $M_1$) and for providing isolation between the RF signals and the DC voltage source circuit. When the second biasing resistor (282) is preferably selected to have a rectangular shape as shown in FIG. 2B, it has a second biasing resistor length $R_{2L}$ (282L), a second biasing resistor width $R_{2W}$ (282W), a second biasing resistor thickness $R_{2T}$ (282T) and a second biasing resistor sheet resistance $R_{\square 2}$. In FIG. 2A, the second biasing resistor (282) connects the second metal electrode (290 or M2) to the second metal electrode contact (290C) through the second metal electrode interconnect (290I) for DC biasing and RF signals isolation.

A potential $V_{DC+}$ is provided through the second metal electrode contact (290C), the second biasing resistor and the second metal electrode interconnect (290I) to the second metal electrode (290 or $M_2$). $V_{DC+}$ and $V_{DC-}$ produce a first DC biasing voltage $V_1 = V_{DC+} - V_{DC-}$ between the second metal electrode (290 or M2) and the first metal electrode (240 or M1) which creates and regulates a first piezoelectric layer depletion region (250d) with a first piezoelectric layer depletion region thickness (250dt) in the first piezoelectric layer (250). RF signals ($RF_+$, $RF_-$) are either applied to the first metal electrode (240) and the second metal electrode interconnect (290I) or they are generated in the MDM FBAR (200a) and are obtained from the first metal electrode and the second metal electrode interconnect (290I).

It should be pointed out that in FIG. 2A, the first metal electrode contact (240C) can also be connected to a positive terminal of the DC biasing voltage source with the second metal electrode contact (290C) connected to the negative terminal of the DC biasing voltage. According to one embodiment of the present invention, the DC biasing and the RF isolation of the MDM FBAR structure can be provided by using only one biasing resistor (either 281 or 282). If only the first biasing resistor (281) is used, the second metal electrode interconnect (290I) will be directly connected to the second metal electrode contact (290C). On the other hand, if only the second biasing resistor (282) is used, the first metal electrode contact (240C) will be directly connected to the first metal electrode (240). Furthermore, a combination of a biasing resistor and a biasing inductor connected in series can as well be used to replace the first or/and the second biasing resistor to provide DC bias voltage to the MDM FBAR structure and an isolation between the RF signal and the DC biasing circuit.

The resistance values $R_1$ and $R_2$ of the first biasing resistor (281) and the second biasing resistor (282) are greater than 200 ohms and are preferably greater than 1,000 ohms for isolation of RF signals. The biasing resistor width $R_{1W}$ and $R_{2W}$ are not greater than the biasing resistor length $R_{1L}$ and $R_{1L}$. The biasing resistor thickness $R_{1T}$ and $R_{2T}$ are preferably less than 2 μm and more preferably less than 0.5 μm to facilitate subsequent patterning either by etching or by lift-off. The biasing resistor sheet resistance $R_{\square 1}$ and $R_{\square 2}$ are 10 ohms/$\square$ or greater and is preferably 100 ohms/$\square$ or greater to obtain a resistance value $R_1$ of 1,000 ohms or greater for allowing application of a DC biasing with a sufficient RF isolation. On the other hand, in order to keep a RC product low and to reduce any unwanted switching delay time for the FBAR, the resistance value $R_2$ and $R_2$ should not be too large. For instance, a typical FBAR may have a capacitance C (between $M_1$ and $M_2$) of 5 pF and a first biasing resistor (281) of 2,000 ohms, the value of $\tau_1 = R_1 \times C = 10^{-8}$ second. When the first biasing resistor resistance value $R_1$ is increased from 2,000 ohms to $2 \times 10^6$ ohms, the value of $\tau_1$ will increase from $10^{-8}$ second to $10^{-5}$ second.

Materials of the biasing resistors may be metals such as Ni, Cr, Ta, W, Mo, NiCr and their alloys. The biasing resistors may also be made of metal oxides and metal oxynitrides such as ZnO, ZnON, InSnO, InSnON, ZnInO ZnInON, ZnSnO, ZnSnON, $RuO_2$, TaN, $Bi_2Ru_2O_7$, $RuO_2$, $Bi_2Ir_2O_7$ and other semiconductors such as Si, as long as the sheet resistance of the biasing resistors is large enough and the biasing resistors have stable thermal properties. The layer of the biasing resistors may be deposited by vacuum methods such as evaporation, DC sputtering and RF sputtering in a chamber with Ar gas or with a gas mixture of Ar, $O_2$ and/or $N_2$. According to one embodiment of this invention, the first biasing resistor (281) and the second biasing resistor (282) are fabricated in same fabrication steps, preferably with same materials, thickness, composition, and sheet resistance on the bottom support membrane (230) or directly on the bottom substrate (210). They may also be fabricated in different fabrication steps and have different materials, different thickness, different composition, and different sheet resistance.

FIG. 2C shows the electric field magnitude $\xi(x, V)$ as a function of distance along the line A-A' in the MDM structure shown in FIG. 2A. The solid line represents the electric filed magnitude $\xi(x, V_1)$ with the first DC biasing voltage $V_1 = V_{DC+} - V_{DC-}$ applied between the second metal electrode (290) and the first metal electrode (240) and the dotted line represents the electric filed magnitude $\xi(x, V_2)$ with a second DC biasing voltage $V_2$ applied between (290) and (240). Under the first DC biasing voltage $V_1$, the first piezoelectric depletion region (250d) of a first piezoelectric depletion region thickness (250dt) together with a first mass loading due to a combination of the first piezoelectric neutral region (250n) and the second metal electrode (290) produce a first resonant frequency $f_1$. When a second DC biasing voltage $V_2$ with a larger value is applied between M2 (290) and M1 (240), the thickness of the first piezoelectric depletion region increases from (250dt) to (250dt') which results in a decreased first piezoelectric neutral region thickness (250nt'). These changes give rise to an increased first piezoelectric depletion region thickness (250dt') and a second mass loading with a decreased value as a result of a combination of the new first piezoelectric neutral region ($250n'$) and the second metal electrode (290), which effects resonance of the MDM FBAR at a second resonant frequency $f_2$. In the same fashion, when a third DC biasing voltage $V_3$ is applied, a third resonant frequency $f_3$ will be created for this FBAR.

Accordingly, a plurality of resonant frequencies may be achieved in the same FBAR (200a) by applying a plurality of DC biasing voltages with different values in a sequential manner through the first biasing resistor (281) and the second biasing resistor (282) thus voltage tuning of the resonant frequency is obtained without the requirement of moving parts in the FBAR. Difference between the second resonant frequency and the first resonant frequency $\Delta f = f_2 - f_1$ for a given DC basing voltage difference $\Delta V_{DC} = V_2 - V_1$ is determined by the difference in the first piezoelectric depletion region thickness: $\Delta 250dt = 250dt' - 250dt = \Delta W_N$ and the change in the mass loading.

The change in the DC biasing voltage causes a change in the electric field magnitude ($\Delta \xi_o$) and a change in the first piezoelectric depletion region thickness ($\Delta W_n$), here $\Delta W_n = x_n(V_2) - x_n(V_1) = 250dt' - 250dt$. The change in the DC biasing voltage ($\Delta V_{DC} = V_2 - V_1$) is given as the area between the dotted electric field magnitude curve $\xi(x, V_2)$ and solid electric field magnitude curve $\xi(x, V_1)$. Since the slopes ($S_{P1}$, $S_{P2}$) of the electric field magnitude curve $\xi(x, V_1)$ or $\xi(x, V_2)$ is proportional to the first piezoelectric layer doping concentration $N_D$ (for n-type doping) and the value of $\Delta W_n/\Delta V_{DC}$ increases when $N_D$ is decreased, the first piezoelectric layer doping concentration $N_D$ may be adjusted according to the required frequency tuning sensitivity for the surface acoustic waves. The tuning sensitivity for the resonant frequency of the MDM FBAR (200a) is enhanced with the first piezoelectric layer doping concentration $N_D$ to be selected in a range of $10^{14}$ cm$^{-3}$ to $10^{21}$ cm$^{-3}$ or to be more preferably selected in the range of $10^{15}$ to $10^{20}$ cm$^{-3}$.

Because the first piezoelectric depletion region (250d) acts as an active region for interactions between the RF signals to be applied (between ($M_1$) and ($M_2$)) and the mechanical acoustic vibrations in the first piezoelectric layer (250), and also because the mass loading which is formed by the first piezoelectric neutral region (250n) and the second metal electrode $M_2$ varies with the DC biasing voltage, the resonant frequency of the FBAR (200a) is tuned and adjusted by the DC biasing voltage applied. It should be noted that the distribution of doping concentration in the first piezoelectric layer (250 or $D_1$) need not be a constant. It can be graded, stepped or have other concentration distributions. A plurality of the tunable FBAR (200a) each with integrated biasing resistors (281) $R_1$ and (282) $R_2$ according to this invention may be combined to form a band pass filter, a switch or a power divider for microwaves or millimeter waves. It should be pointed out that for a first piezoelectric semiconductor layer (250) doped to have a p-type conduction, the electric field distributions should have a positive slope.

Material of the first piezoelectric layer $D_1$ (250) is selected from a group including: AlN, GaN, AlGaN, ZnO, GaAs, AlAs, AlGaAs, as long as they are piezoelectric with sufficient acoustic coupling coefficients, are semiconducting and can be doped to p-type and/or n-type conduction. The first piezoelectric layer thickness (250t) is selected to be in a range of 50 nm to 20 μm, dependent on the acoustic wave velocity in the first piezoelectric layer (250) and the first frequency $f_{o1}$ of resonant required for the application.

The first metal electrode $M_1$ (240) and the second metal electrode $M_2$ (290) in FIG. 2A may have multilayer structures. For the top layer in the first metal electrode $M_1$ which contacts the first piezoelectric semiconductor layer $D_1$ (250), the work function is advantageously selected so that $M_1$ forms a Schottky junction with the first piezoelectric semiconductor layer $D_1$ (250). The work function of the bottom layer in the second metal electrode $M_2$ (290) which contacts the first piezoelectric semiconductor layer $D_1$ (250) is advantageously selected so that $M_2$ (290) forms an ohmic contact with the first piezoelectric semiconductor layer $D_1$ (250).

Therefore, for a n-type doped first piezoelectric semiconductor layer $D_1$ (250), it is preferred to have the work function of the top layer in the first metal electrode (240) to be substantially larger than that of the first piezoelectric semiconductor layer (250). It is also preferred to have the work function of the bottom layer in the second metal electrode (290) to be the same or less than that of the first piezoelectric semiconductor layer (250). Materials for the top layer in the first metal electrode (240) may be selected from a group including: Ni, Pt, Pd, Au and their alloys, as long as they have a large enough work function. Whereas materials for the rest of the first metal electrode (240) may be selected from a group including: Mo, Al, Ti, Cu, Au and their alloys to reduce electrical resistance. Materials for the bottom layer in the second metal electrode (290) may be selected from a group including: Ti, Al, W, Mo, Ta, Nb, Ha and their alloys whereas materials for the rest of the second metal electrode (290) may be selected from a group including: Mo, Al, Ti, Cu, Au and their alloys to reduce electrical resistance.

When the first piezoelectric semiconductor $D_1$ (250) is doped p-type, it is preferred to have the work function of the top layer in the first metal electrode (240) to be substantially less than that of the first piezoelectric semiconductor layer (250). It is also preferred to have the work function of the bottom layer in the second metal electrode (290) to be the same as or larger than that of the first piezoelectric semiconductor layer (250). Materials for the top layer in the first metal electrode (240) may be selected from a group including: Ti, Al, W, Mo, Ta, Nb, Ha and their alloys, as long as they have a small enough work function. Whereas materials for the rest of the first metal electrode (240) may be selected from a group including: Mo, Al, Ti, Cu, Au and their alloys to reduce electrical resistance. Materials for the bottom layer of the second metal electrode (290) may be selected from a group including: Ni, Pt, Pd, Au and their alloys, as long as the work function is large enough. Materials for the rest of the second metal electrode (290) may be selected from a group including: Mo, Al, Ti, Cu, Au and their alloys to reduce electrical resistance.

Materials of the first metal electrode contact (240C) may be the same as that of first metal electrode (240) and it is preferably deposited in the same deposition run with the first metal electrode (240). Whereas materials of the second metal electrode contact (290C) and the second metal electrode contact interconnect (290I) may be the same as the second metal electrode (290) and they are preferably deposited in the same deposition run with the second metal electrode (290).

Materials of the bottom substrate (210) may be selected from a group including: Si, GaAs, sapphire, quartz and glass. Materials of the bottom support membrane (230) may be selected from a group including: SiO$_2$, Si$_3$N$_4$, SiON, as long as they have sufficient mechanical strength and low enough attenuation to acoustic waves. Materials of the bottom support membrane (230) and the bottom support membrane thickness (230t) may also be selected to effect a temperature compensation to reduce unwanted shift of resonant frequency due to temperature fluctuation during the operation.

In order to improve thermal stability of the device (200a), the temperature compensation layer (295) is included. Materials of the temperature compensation layer (295) may be $SiO_2$ or SiON. The first passivation layer (298) may be selected from a material group of: $SiO_2$, $Si_3N_4$, SiON, $HfO_2$, and their mixtures.

An $M_1I_1D_1M_2$ FBAR Structure with Integrated Biasing Resistors

To obtain an operation frequency, the value of DC biasing voltage $V_1=V_{DC+}-V_{DC-}$ in the tunable $M_1D_1M_2$ FBAR provided in FIG. 2A may be too high for some mobile devices and the frequency tuning sensitivity may not be sufficiently precise. In order to reduce the required DC biasing voltage value and to improve the tuning sensitivity, a frequency tunable $M_1I_1D_1M_2$ FBAR structure with integrated biasing resistors is provided according to another embodiment of this invention.

Figure 2D:
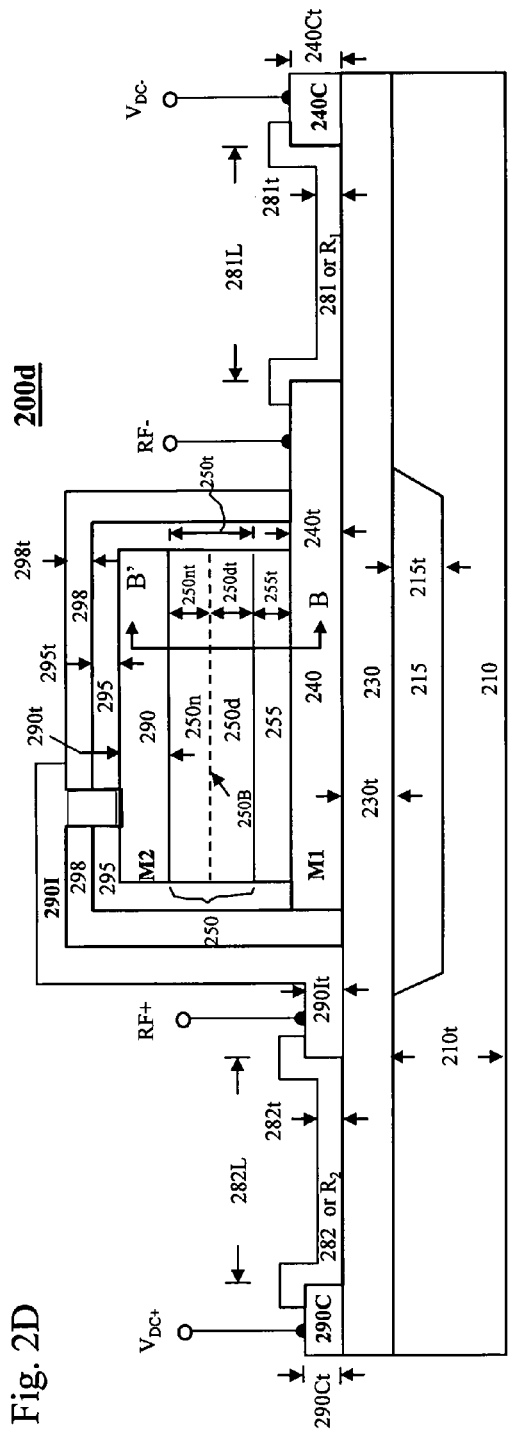
FIG. 2D shows a schematic cross-sectional view of a frequency tunable $M_1I_1D_1M_2$ FBAR (200d) with integrated biasing resistors according to this invention. The MIDM FBAR structure comprises a substrate, an acoustic wave isolation region, a bottom support membrane, a first electrode ($M_1$), a first intrinsic piezoelectric semiconductor layer ($I_1$), a first piezoelectric semiconductor layer ($D_1$) and a second metal electrode ($M_2$). The first piezoelectric depletion region in the first piezoelectric layer and the first intrinsic semiconductor layer form a combined piezoelectric active region for interactions between the RF signals and the mechanical acoustic vibrations.

FIG. 2D shows a schematic diagram of a portion of an $M_1I_1D_1M_2$ or an MIDM FBAR structure (200d) with integrated biasing resistors. Here, $M_1$ is a first metal electrode, $I_1$ is an intrinsic piezoelectric semiconductor layer, $D_1$ is a doped piezoelectric semiconductor layer and $M_2$ is a second metal electrode. It should be noted that a FBAR with an MDIM structure can be readily obtained by switch the intrinsic piezoelectric semiconductor layer with the doped piezoelectric layer in the structure. For simplicity reason, only MIDM FBAR structure will be described.

The MIDM FBAR structure in FIG. 2D comprises a bottom substrate (210) with a bottom substrate thickness (210t); an acoustic isolation region (215) having an acoustic isolation region thickness (215t); a bottom support membrane (230) with a bottom support membrane thickness (230t); a first metal electrode $M_1$ (240) having a first metal electrode thickness (240t); a first metal electrode contact (240C) having a first metal electrode contact thickness (240Ct) connected to a negative terminal of a DC biasing voltage source; a first intrinsic piezoelectric semiconductor layer (255) with a first intrinsic piezoelectric layer thickness (255t), a first piezoelectric layer doping type and a first piezoelectric layer doping concentration; a first piezoelectric semiconductor layer (250) with a first piezoelectric layer thickness (250t); a second metal electrode (290) with a second metal electrode thickness (290t); a second metal electrode contact (290C) having a second metal electrode contact thickness (290Ct) connected to a positive terminal of the DC biasing voltage source; a first temperature compensation layer (295) with a first temperature compensation layer thickness (295t) to improve thermal stability of the FBAR; a first passivation layer (298) with a first passivation layer thickness (298t) and a second metal electrode interconnect (290I) with a second metal electrode interconnect thickness (290It), wherein the second metal electrode interconnect (290I) is electrically connected to the second metal electrode (290) through an opening in the first passivation layer (298) and the first temperature compensation layer (295). In (200d), the acoustic isolation region (215) may be an air cavity or a multi layer reflector having a plurality of reflector layers for acoustic wave isolation.

It should be noted that in FIG. 2D, the first metal electrode contact (240C) can also be connected to a positive terminal of the DC biasing voltage source with the second metal electrode contact (290C) connected to the negative terminal of the DC biasing voltage.

The first piezoelectric semiconductor layer (250) is a doped semiconductor which may be n-type or p-type and preferably to be n-type. The first intrinsic piezoelectric layer (255) is not intentionally doped with a low doping concentration ($10^{13}$ $cm^{-3}$ or less) and is electrically insulating. The first piezoelectric semiconductor layer (250) has two parts separated by a first piezoelectric depletion region edge (250B): a first piezoelectric depletion region (250d) with a first piezoelectric depletion region thickness (250dt) and a first piezoelectric neutral region (250n) with a first piezoelectric neutral region thickness (250nt). The first piezoelectric neutral region (250n) is electrically conducting and the first piezoelectric depletion region (250d) is intrinsic and electrically insulating. In this MIDM FBAR, the first intrinsic piezoelectric layer (255) and the first piezoelectric depletion region (250d) make up a piezoelectric active layer to allow interactions between the RF signals and acoustic signals to take place.

Since the interactions between the RF signals and acoustic signals take place mainly in the first piezoelectric depletion region (250d) and the first intrinsic piezoelectric layer (255), they are affected by the thickness (250dt) of the first piezoelectric depletion region (250). In view of the fact that the thickness (250dt) is adjustable by varying the polarity or/and the magnitude of the DC biasing voltage applied between the first metal electrode (240) and the second metal electrode (290), therefore, the resonant properties and frequencies of the MDM FBAR structure and any filters, switches or other devices based on the semiconducting piezoelectric layers microwave acoustic effect can be tuned and adjusted by changing the polarity and/or the magnitude of the DC voltage according to this invention.

A first biasing resistor (281) with a first biasing resistor resistance value $R_1$ and a second biasing resistor with a second biasing resistor resistance value $R_2$ are integrated with the MIDM FBAR for providing a DC bias voltage and an isolation between the RF signal and the DC biasing circuit. The first biasing resistor (281) and the second biasing resistor (282) are preferably an integrated thin film resistor and may have different shapes such as rectangle, zig-zag, square, oval, triangle, trapezium, diamond, rhombus and parallelogram. When the first resistor (281) is preferably having a rectangular shape to simplify description, as shown in FIG. 2B, it has a first biasing resistor length $R_{1L}$ (281L), a first biasing resistor width $R_{1W}$ (281W), a first biasing resistor thickness $R_{1T}$ (281T) and a first biasing resistor sheet resistance $R_{\square 1}$. In FIG. 2D, the first biasing resistor (281) connects the first metal electrode (240) to the first metal electrode contact (240C), for the purposes of providing a potential $V_{DC-}$, through (240C) and (281) to the first metal electrode (240 or $M_1$) and for providing isolation between the RF signals from the DC voltage source circuit. When the second biasing resistor (282) is preferably selected to have a rectangular shape as shown in FIG. 2B, it has a second biasing resistor length $R_{2L}$ (282L), a second biasing resistor width $R_{2W}$ (282W), a second biasing resistor thickness $R_{2T}$ (282T) and a second biasing resistor sheet resistance $R_{\square 2}$. In FIG. 2D, the second biasing resistor (282) connects the second metal electrode (290 or M2) to the second metal electrode contact (290C) through the second metal electrode interconnect (290I) for DC biasing and RF signals isolation.

The first biasing resistor thickness $R_{1T}$ and the second biasing resistor thickness $R_{2T}$ are preferably less than 2 µm and are more preferably less than 0.5 µm to facilitate subsequent patterning either by etching or by lift-off. The sheet resistance $R_{\square 1}$ of the first biasing resistor (281) and the sheet resistance $R_{\square 2}$ of the second biasing resistor (282) are 10 ohms/$\square$ or greater and are preferably 100 ohms/$\square$ or greater to obtain a resistance value $R_1$ and $R_2$ of 1,000 ohms or greater for allowing application of a DC biasing with a sufficient RF isolation. On the other hand, in order to keep a small enough RC product and to reduce unwanted switching delay time for the FBAR, the resistance value $R_2$ and $R_2$ should not be too large.

Materials of the thin film biasing resistors may be metals such as Ni, Cr, Ta, W, Mo, NiCr and their alloys. They may also be metal oxide and metal oxynitride such as ZnO, ZnON, InSnO, InSnON, ZnInO ZnInON, ZnSnO, ZnSnON, $RuO_2$, TaN, $Bi_2Ru_2O_7$, $RuO_2$, $Bi_2Ir_2O_7$ and other semiconductors such as Si, as long as the sheet resistance of the biasing resistors is large enough and the biasing resistors have stable thermal properties. The layer of the biasing resistors may be deposited by vacuum methods such as evaporation, DC sputtering and RF sputtering in a chamber with Ar gas or with a gas mixture of Ar, $O_2$ and/or $N_2$. According to one embodiment of this invention, the first biasing resistor (281) and the second biasing resistor (282) are fabricated in same fabrication steps, preferably with the same materials, thickness, composition, and sheet resistance on the bottom support membrane (230) or on the bottom substrate (210). They may also be fabricated in different fabrication steps and have different materials, different thickness, different composition, and different sheet resistance.

It should also be noted that only one biasing resistor (either 281 or 282) can be used to provide a DC bias voltage and an isolation between the RF signal and the DC biasing circuit. According to one embodiment of the present invention, the DC biasing and the RF isolation of the MIDM FBAR structure can be provided by using only one biasing resistor (either 281 or 282). If only the first biasing resistor (281) is used, the second metal electrode interconnect (290I) will be directly connected to the second metal electrode contact (290C). On the other hand, if only the second resistor (282) is used, the first metal electrode contact (240C) will be directly connected to the first metal electrode (240). Furthermore, a combination of a biasing resistor and a biasing inductor connected in series can also be used to replace the first or/and the second biasing resistor to provide DC bias voltage to the MIDM FBAR structure and an isolation between the RF signal and the DC biasing circuit.

A potential $V_{DC+}$ is provided through the second metal electrode contact (290C), the second biasing resistor (282) and the second metal electrode interconnect (290I) to the second metal electrode (290 or $M_2$). $V_{DC+}$ and $V_{DC-}$ generate a first DC biasing voltage $V_1 = V_{DC+} - V_{DC-}$ between the second metal electrode (290 or M2) and the first metal electrode (240 or M1) which creates and regulates a first piezoelectric layer depletion region (250d) with a first piezoelectric layer depletion region thickness (250dt) in the first piezoelectric layer (250), which results in a first piezoelectric neutral region (250n) with a first piezoelectric neutral region thickness (250nt). RF signals ($RF_+$, $RF_-$) are either applied to the first metal electrode (240) and the second metal electrode interconnect (290I) or they are generated in the MIDM FBAR (200d) and are obtained from the first metal electrode and the second metal electrode interconnect (290I).

Figure 2E:
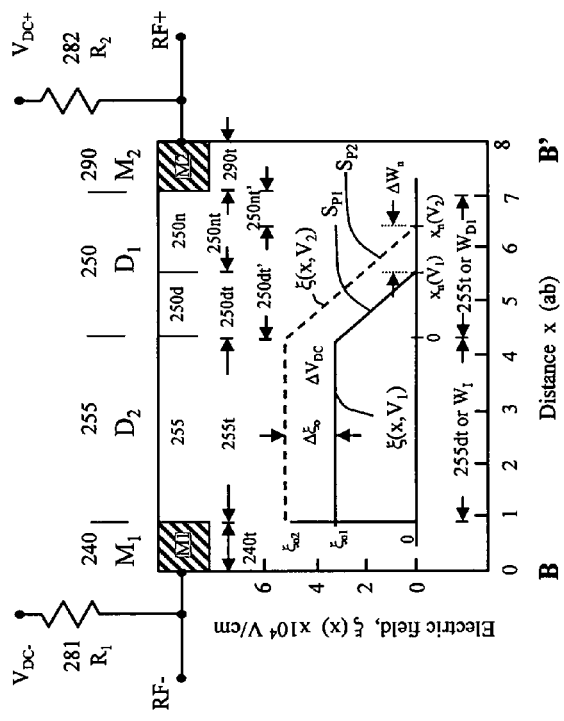
FIG. 2E shows variation of electric field $\xi(x)$ with distance along the line B-B' in the MIDM structure shown in FIG. 2D with a DC biasing voltage applied between the first metal electrode and the second metal electrode for frequency tuning. A change in the DC biasing voltage $\Delta V_{DC}$ causes a change in the electric field $\Delta \xi_o$ in the first intrinsic piezoelectric semiconductor layer ($I_1$), a change in the depletion region thickness $\Delta W_n$, a change in the thickness of the combined piezoelectric active region and hence a change in the resonant frequency of the MIDM FBAR.

FIG. 2E shows the distribution of electric field magnitude $\xi(x, V)$ with distance along the line B-B' in the MIDM structure shown in FIG. 2D. The solid line represents the electric filed magnitude $\xi(x, V_1)$ with a first DC biasing voltage $V_1 = V_{DC+} - V_{DC-}$ applied between the second metal electrode (290, $M_2$) and the first metal electrode (240, $M_1$). Under the first DC biasing voltage $V_1$, the first piezoelectric depletion region (250d) with a first piezoelectric depletion region thickness (250dt) is formed and a first mass loading due to a combination of the first piezoelectric neutral region (250n) and the second metal electrode ($M_2$, 290) yields a first resonant frequency $f_1$. When a second DC biasing voltage $V_2$ with a larger value is applied between and M2 (290) and M1 (240), the first piezoelectric depletion region thickness increases from (250dt) to (250dt') which results in a decreased first piezoelectric neutral region thickness (250nt'). These changes give rise to a increased active layer thickness and a second mass loading with a reduced value, as a result of a combination of the new first piezoelectric neutral region (250n') and the second metal electrode (290), which effects resonance of the MIDM FBAR at a second resonant frequency $f_2$. In the same fashion, when a third DC biasing voltage $V_3$ is applied, a third resonant frequency $f_3$ will be created for this MIDM FBAR.

Accordingly, a plurality of resonant frequencies may be achieved in the same MIDM FBAR (200d) by applying a plurality of DC biasing voltages with different values in a sequential manner through the first biasing resistor (281) and second biasing resistor (282) thus voltage tuning of the resonant frequency is achieved without the requirement of any moving parts in the MIDM FBAR. Difference between the second resonant frequency and the first resonant frequency $\Delta f = f_2 - f_1$ for a given DC basing voltage difference $\Delta V_{DC} = V_2 - V_1$ is determined by the first piezoelectric depletion thickness difference $\Delta 250dt = 250dt' - 250dt = \Delta W_n$ and the change in the mass loading. It should be pointed out that for a first piezoelectric semiconductor layer (250) doped to have a p-type conduction, the electric field distributions should have a positive slope.

As the slopes ($S_{P1}$, $S_{P2}$) of the electric field magnitude curves $\xi(x, V_1)$ and $\xi(x, V_2)$ is proportional to the first piezoelectric doping concentration $N_D$ (for n-type doping) and the value of $\Delta W_n / \Delta V_{DC}$ increases when $N_D$ is decreased, according to this invention, the tuning sensitivity for the resonant frequency of the MIDM FBAR (200d) can be enhanced by preferably selecting the first piezoelectric layer doping concentration $N_D$ in a range of $10^{14}$ cm$^{-3}$ to $10^{21}$ cm$^{-3}$ or more preferably by selecting $N_D$ in the range of $10^{15}$ to $10^{20}$ cm$^{-3}$.

The change in the DC biasing voltage causes a change in the electric field magnitude ($\Delta \xi_o$) and a change in the first piezoelectric depletion region thickness ($\Delta W_n$) of the first piezoelectric depletion region, here, $\Delta W_n = x_n(V_2) - x_n(V_1)$ or $250dt' - 250dt$. Due to the existence of the first intrinsic piezoelectric semiconductor layer (255), the change in the DC biasing voltage ($\Delta V_{DC} = V_2 - V_1$), given by the area between the dotted electric field magnitude curve $V_2$) and solid electric field magnitude curve $\xi(x, V_1)$ is partly dropped across (255). And the area ($\Delta V_{DC} = V_2 - V_1$) has two parts: one between the two horizontal lines in the first intrinsic piezoelectric semiconductor layer (255) and the other between the two inclined lines in the first piezoelectric semiconductor layer (250). Therefore, the same DC voltage change will cause a smaller change in the $\Delta W_n$ ($= x_n(V_2) - x_n(V_1)$) as compared to the MDM structure shown in FIG. 2A.

Due to the low ion density in the first intrinsic piezoelectric semiconductor layer (255), the electric field magnitude $\xi_{o1}$ required to form a first piezoelectric depletion region thickness (250dt) for achieving the desired resonant frequency could be reduced compared to that in the MDM FBAR structure shown in FIG. 2A. Furthermore, the variation of $x_n(V)$ with the variation of the DC biasing voltage V would be much less with the presence of the first intrinsic piezoelectric semiconductor layer (255), hence the tuning sensitivity of the resonant frequency by the DC voltage would increase. The MIDM FBAR structure also allows a higher doping concentration for the first piezoelectric semiconductor layer (250) than that for the MDM structure.

Because the first piezoelectric depletion region (250d) acts as an active region for interactions between the RF signals to be applied (between ($M_1$) and ($M_2$)) and the mechanical acoustic vibrations in the piezoelectric semiconductor layers (250, 255) and the thickness of the first piezoelectric depletion region thickness varies with the DC voltage, and also because the mass loading formed by the first piezoelectric layer neutral region (250n) and the second metal electrode $M_2$ (290) varies with the DC biasing voltage, the resonant frequency of the MIDM FBAR (200d) is tuned and adjusted by the DC biasing voltage. Since the change in the first piezoelectric depletion region thickness $\Delta W_n$ (250dt'−250dt) with the change in the DC voltage is larger when the first piezoelectric doping concentrations $N_D$ is decreased, therefore, the first piezoelectric doping concentration $N_D$ may also be adjusted according to the need for the tuning sensitivity of the surface acoustic waves frequency. It should be noted that the distribution of doping concentration in the first piezoelectric layer (250) need not be a constant. It can be graded, stepped or have other concentration distributions. A plurality of the tunable MIDM FBAR (200d) each with integrated biasing resistors (281) $R_1$ and (282) $R_2$, according to this invention may be combined to form a band pass filter, a switch or a power divider for microwaves or millimeter waves.

Material of the first piezoelectric semiconductor layer (250) is selected from a compound material group including: AlN, GaN, AlGaN, ZnO, GaAs, AlAs, AlGaAs as long as they are piezoelectric with sufficient acoustic-electric coupling coefficients and are semiconducting and can be doped to p-type and/or n-type conduction. Material of the first intrinsic piezoelectric layer (255) is selected from a compound material group including: AlN, GaN, AlGaN, ZnO, GaAs, AlAs, AlGaAs, $LiNbO_3$, PZT, $BaTiO_3$, quartz and $KNbO_3$ as long as they are piezoelectric with sufficiently large acoustic-electric coupling coefficients and are compatible to the first piezoelectric layer (250). The first piezoelectric layer thickness (250t) is selected to be in a range of 20 nm to 50 μm, dependent on the acoustic wave velocity in the first piezoelectric semiconductor layer (250) and the first frequency $f_{o1}$ of resonant and a plurality of other resonant frequencies required for the application. The first intrinsic piezoelectric layer thickness (255t) is selected in a range of 20 nm to 50 μm dependent on the acoustic wave velocity in the first intrinsic piezoelectric layer and the first frequency $f_{o1}$ and a plurality of other resonant frequencies required for the applications.

To improve thermal stability, a temperature compensation layer (295) with a temperature compensation layer thickness (295t) may be adopted. Materials of the temperature compensation layer may be selected from a group of $SiO_2$ and SiON. The first passivation layer (298) may be selected from a material group of: $SiO_2$, $Si_3N_4$, SiON, $HfO_2$, and their mixtures. Materials of the bottom substrate (210) may be selected from a group including: Si, GaAs, sapphire, quartz and glass. Materials of the bottom support membrane (230) may be selected from a group including $SiO_2$, $Si_3N_4$, SiON, as long as they have sufficient mechanical strength and low enough attenuation to acoustic waves. Materials of the bottom support membrane (230) and the bottom support membrane thickness (230t) may also be selected to effect a temperature compensation to reduce unwanted shift of resonant frequency due to temperature fluctuation during the operation.

A plurality of the tunable FBAR (200d) with an MIDM structure each with integrated biasing resistors (281) $R_1$ and (282) $R_2$ according to this invention may be combined to form a band pass filter, switch, power divider for microwaves or millimeter waves.

An $M_1D_1D_2M_2$ FBAR Structure with Integrated Biasing Resistors

Figure 3A:
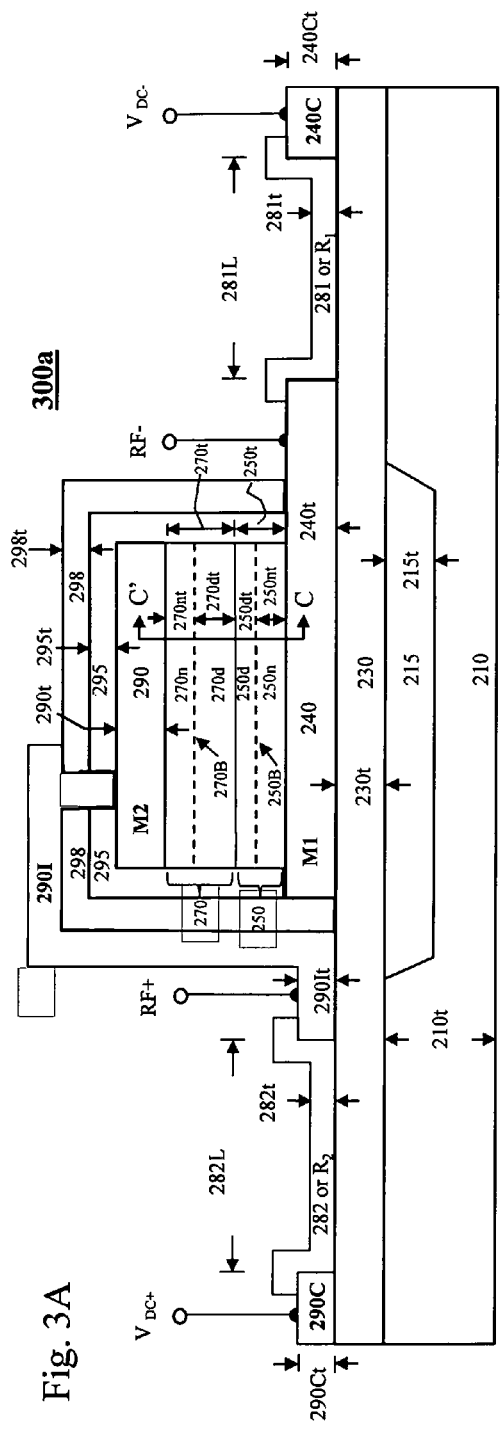
FIG. 3A is a schematic cross-sectional diagram of a frequency tunable $M_1D_1D_2M_2$ FBAR (300a) with integrated biasing resistors according to this invention. The MDDM FBAR structure comprises a bottom substrate, an acoustic wave isolation region, a bottom support membrane, a first metal electrode ($M_1$), a first piezoelectric layer ($D_1$) doped to a first piezoelectric conducting type, a second piezoelectric layer ($D_2$) doped to a second piezoelectric conducting type opposite to the first piezoelectric conducting type, a second metal electrode ($M_2$). A first piezoelectric depletion region in the first piezoelectric layer and a second piezoelectric depletion region in the second piezoelectric semiconductor layer form a combined piezoelectric active region for interactions between the RF signals and the mechanical acoustic vibrations.

FIG. 3A shows a schematic diagram of a portion of an $M_1D_1D_2M_2$ FBAR or an MDDM FBAR Structure (300a) with integrated biasing resistors according to one other embodiment of this invention. Here, $M_1$ is a first metal electrode, $D_1$ is a doped first piezoelectric semiconductor layer, $D_2$ is a doped second piezoelectric semiconductor layer and $M_2$ is a second metal electrode. The $M_1D_1D_2M_2$ FBAR or MDDM FBAR structure (300a) comprises a bottom support membrane (230) with a bottom support membrane (230t) on a bottom substrate (210) with a bottom substrate thickness (210t); an acoustic isolation region (215) having an acoustic isolation region thickness (21St); a first metal electrode (240) with a first metal electrode thickness (240t); a first metal electrode contact (240C) having a first metal electrode contact thickness connected to a negative terminal of a DC biasing voltage source; a doped first piezoelectric semiconductor layer (250) with a first doped piezoelectric layer thickness (250t), a first piezoelectric layer doping type and a first piezoelectric layer doping concentration; a doped second piezoelectric semiconductor layer (270) with a second doped piezoelectric layer thickness (270t), a second piezoelectric layer doping type which is opposite to the first piezoelectric layer doping type, and a second piezoelectric layer doping concentration; a second metal electrode (290) with a second metal electrode thickness (290t); a second metal electrode contact (290C) having a second metal electrode contact thickness (290Ct) connected to a positive terminal of the DC biasing voltage source; a first passivation layer (298) with a first passivation layer thickness (298t); a first temperature compensation layer (295) with a first temperature compensation layer thickness (295t) to improve thermal stability of the MDDM FBAR (300a); and a second metal electrode interconnect (290I) with a second metal electrode interconnect thickness (290It), wherein the second metal electrode interconnect (290I) is electrically connected to the second metal electrode (290) through an opening in the first passivation layer (298) and the first temperature compensation layer (295). In (300a), the acoustic isolation region (215) may be an air cavity or a multi layer reflector having a plurality of reflector layers for acoustic wave isolation.

The first piezoelectric semiconductor layer (250) is a doped semiconductor which may be n-type or p-type and preferably to be n-type. The second piezoelectric semiconductor layer (270) is also a doped semiconductor. In FIG. 3A, the first piezoelectric semiconductor layer (250) is separated by a first piezoelectric depletion region edge (250B) into two regions: a first piezoelectric depletion region (250d) with a first piezoelectric depletion region thickness (250dt) and a first piezoelectric neutral region (250n) with a first piezoelectric neutral region thickness (250nt). Similarly, the second piezoelectric semiconductor layer (270) is separated by a second piezoelectric depletion region edge (270B) into two regions: a second piezoelectric depletion region (270d) with a second piezoelectric depletion region thickness (270dt) and a second piezoelectric neutral region (270n) with a second piezoelectric neutral region thickness (270nt). The first piezoelectric neutral region (250n) and the second piezoelectric neutral region (270n) are electrically conducting and the first piezoelectric depletion region (250d) and the second piezoelectric depletion region (270n) are intrinsic and electrically insulating. In this MDDM FBAR, the first piezoelectric depletion region (250d) and the second piezoelectric depletion region (270d) constitute a combined piezoelectric active layer to allow interactions between the RF signals and the acoustic signals to occur.

Since the interactions between the RF signals and acoustic signals take place mainly in the first piezoelectric depletion region (250d) and the adjacent second piezoelectric depletion region (270d), they are affected by the thicknesses (250dt, 270dt) of the first piezoelectric depletion region (250) and the second piezoelectric depletion region (270dt). Given that (250dt) and (270dt) are adjustable by varying the polarity or/and the magnitude of the DC biasing voltage applied between the first metal electrode (240) and the second metal electrode (290), therefore, the resonant properties and frequencies of the MDDM FBAR structure and any filters, switches or other devices based on the semiconducting piezoelectric layers microwave acoustic effect can be tuned and adjusted by changing the polarity and/or the magnitude of the DC voltage according to this invention.

A first biasing resistor (281) with a first biasing resistor resistance value $R_1$ and a second biasing resistor (282) with a second biasing resistor resistance value $R_2$ are integrated with the MDDM FBAR (300a) for providing a DC bias voltage and an isolation between the RF signal and the DC biasing circuit. The first biasing resistor (281) and the second biasing resistor (282) are preferably integrated thin film resistors and may have different shapes such as rectangle, zig-zag, square, oval, triangle, trapezium, diamond, rhombus, parallelogram. When the first biasing resistor (281) is preferably having a rectangular shape as shown in FIG. 2B, it has a first biasing resistor length $R_{1L}$ (281L), a first biasing resistor width $R_{1W}$ (281W, FIG. 2B), a first biasing resistor thickness $R_{1T}$ (281t) and a first biasing resistor sheet resistance $R_{\square 1}$. In the MDDM FBAR structure (300a), the first biasing resistor (281) connects the first metal electrode (240) to the first metal electrode contact (240C), for providing a potential $V_{DC-}$ through (240C) and (281) to the first metal electrode (240 or $M_1$) and for providing isolation between the RF signals from the DC voltage source circuit. When the second biasing resistor (282) is preferably having a rectangular shape as shown in FIG. 2B, it has a second biasing resistor length $R_{2L}$ (282L), a second biasing resistor width $R_{2W}$ (282W, FIG. 2B), a second biasing resistor thickness $R_{2T}$ (282T) and a second biasing resistor sheet resistance $R_{\square 2}$. In FIG. 3A, the second biasing resistor (282) connects the second metal electrode (290 or M2) to the second metal electrode contact (290C) through the second metal electrode interconnect (290I) for DC biasing and RF signals isolation. RF signals (RF$_+$, RF$_-$) are either applied to the first metal electrode (240) and the second metal electrode interconnect (290I) or they are generated in the MDDM FBAR (300a) and are obtained from the first metal electrode (240) and the second metal electrode interconnect (290I).

It should be pointed out that in FIG. 3A, the first metal electrode contact (240C) may also be connected to a positive terminal of the DC biasing voltage source with the second metal electrode contact (290C) connected to the negative terminal of the DC biasing voltage. According to one embodiment of the present invention, the DC biasing and the RF isolation of the MDDM FBAR structure (300a) may be provided by using only one biasing resistor (either 281 or 282). If only the first biasing resistor (281) is used, the second metal electrode interconnect (290I) will be directly connected to the second metal electrode contact (290C). On the other hand, if only the second resistor (282) is used, the first metal electrode contact (240C) will be directly connected to the first metal electrode (240). Furthermore, a combination of a biasing resistor and a biasing inductor connected in series can as well be used to replace the first or/and the second biasing resistor to provide DC bias voltage to the MDDM FBAR structure and an isolation between the RF signal and the DC biasing circuit.

The resistance values $R_1$ and $R_2$ of the first biasing resistor (281) and the second biasing resistor (282) are greater than 200 ohms and are preferably greater than 1,000 ohms for isolation of RF signals. The biasing resistor width $R_{1W}$ and $R_{2W}$ are not greater than the biasing resistor length $R_{1L}$ and $R_{1L}$. The biasing resistor thickness $R_{1T}$ and $R_{2T}$ are preferably less than 2 µm and are more preferably less than 0.5 µm to facilitate subsequent patterning either by etching or by lift-off. The first and the second biasing resistor sheet resistances $R_{\square 1}$ and $R_{\square 2}$ are 10 ohms/$\square$ or greater, preferably 100 ohms/$\square$ or greater to obtain biasing resistor resistance value of 1,000 ohms or greater for allowing application of DC biasing voltages with a sufficient RF isolation. However, in order to keep a small enough RC constant and to reduce unwanted switching delay time for the FBAR, the biasing resistor resistance value $R_1$ and $R_2$ should not be too large.

Materials of the thin film biasing resistors may be metals such as Ni, Cr, Ta, W, Mo, NiCr and their alloys. They may also be metal oxide and metal oxynitride such as ZnO, ZnON, InSnO, InSnON, ZnInO ZnInON, ZnSnO, ZnSnON, RuO$_2$, TaN, Bi$_2$Ru$_2$O$_7$, RuO$_2$, Bi$_2$Ir$_2$O$_7$ and other semiconductors such as Si, as long as the sheet resistance of the biasing resistors is large enough and the biasing resistors have stable thermal properties. The layer of the biasing resistors may be deposited by vacuum methods such as evaporation, DC sputtering and RF sputtering in a chamber with Ar gas or with a gas mixture of Ar, O$_2$ and/or N$_2$. According to one embodiment of this invention, the first biasing resistor (281) and the second biasing resistor (282) are fabricated in same fabrication steps, preferably with the same materials, thickness, composition, and sheet resistance on the bottom support membrane (230) or on the bottom substrate (210). They may also be fabricated in different fabrication steps and have different materials, different thickness, different composition, and different sheet resistance.

A potential $V_{DC+}$ is provided through the second metal electrode contact (290C), the second biasing resistor (282) and the second metal electrode interconnect (290I) to the second metal electrode (290 or M$_2$). $V_{DC+}$ and $V_{DC-}$ produce a first DC biasing voltage $V_1=V_{DC+}-V_{DC-}$ between the second metal electrode (290 or M2) and the first metal electrode (240 or M1). This first DC biasing voltage $V_1$ creates the first piezoelectric depletion region (250d) in the first piezoelectric layer (250) and the second piezoelectric depletion region (270d) in the second piezoelectric layer (270) with the second piezoelectric depletion region (270d) adjacent to the first piezoelectric depletion region (250d). The first DC Biasing voltage $V_1$ also controls the first piezoelectric depletion region thickness (250dt) and the second piezoelectric depletion region thickness (270dt).

Figure 3B:
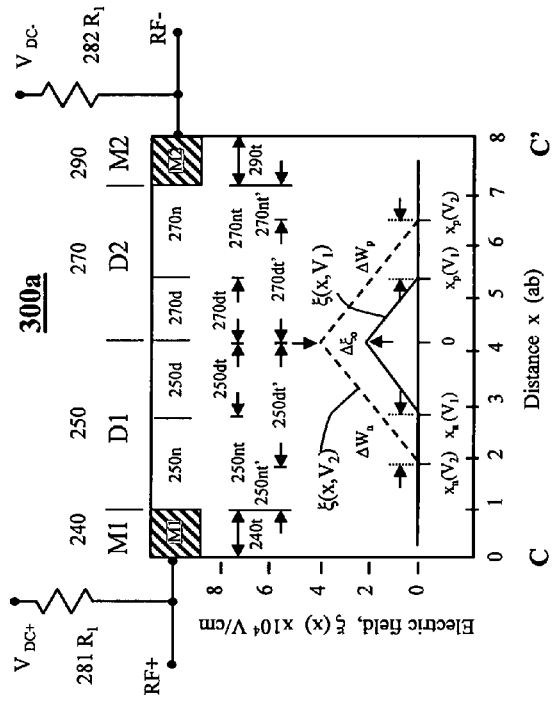
FIG. 3B shows variation of electric field magnitude $\xi(x)$ with distance along the line C-C' in the MDDM FBAR structure shown in FIG. 3A with a DC biasing voltage applied between the first metal electrode and the second metal electrode for frequency tuning. A change in the DC biasing voltage $\Delta V_{DC}$ causes a change in the electric field in the first piezoelectric layer and the second piezoelectric layer, hence a change in the first piezoelectric depletion region thickness $\Delta W_n$ and a change in the second piezoelectric depletion region thickness $\Delta W_p$. The change in the combined piezoelectric active region thickness $\Delta W_n + \Delta W_p$ effects a change in the resonant frequency of the MDDM FBAR.

FIG. 3B shows the distribution of the electric field magnitude $\xi(x, V_1)$ with distance along the line C-C' in the MDDM FBAR structure in FIG. 3A. The solid line represents the electric filed magnitude $\xi(x, V_1)$ with the first DC biasing voltage $V_1=V_{DC+}-V_{DC-}$ applied between the second metal electrode (290 or $M_2$) and the first metal electrode (240 or $M_1$) and the dotted line represents the electric filed magnitude $\xi(x, V_2)$ with a second DC biasing voltage $V_2$ applied between (290) and (240). It is noted that the maximum electrical field occurs at the interface between the first doped piezoelectric layer and second doped piezoelectric layer. Under the first DC biasing voltage $V_1$, the first piezoelectric depletion region (250*d*) of a thickness (250*dt*) and the second piezoelectric layer depletion region (270*d*) of a thickness (270*dt*) together with a first mass loading due to a combination of the first piezoelectric neutral region (250*n*) of a thickness (250*nt*), the second piezoelectric neutral region (270*n*) of a thickness (270*nt*) and the second metal electrode ($M_2$, 290) yield a first resonant frequency $f_1$. When a second DC biasing voltage $V_2$ with a larger value is applied, the electric field magnitude in the first piezoelectric depletion region (250*d*) and in the second piezoelectric depletion region (270*d*) increases to give new electric field distribution $\xi(x, V_2)$. This change gives rise to a new first piezoelectric depletion region (250*d'*) with a new first piezoelectric depletion region thickness (250*dt'*), a new first piezoelectric neutral region (250*n'*) with a new first piezoelectric neutral region thickness (250*nt'*), a new second piezoelectric depletion region (270*d'*) with a new second piezoelectric depletion region thickness (270*dt'*) and a new second piezoelectric neutral region (270*n'*) with a new second piezoelectric neutral region thickness (270*nt'*). This results in increased thicknesses (250*dt'*, 270*dt'*) for the first and second piezoelectric depletion regions (250*d'*, 270*d'*) and decreased thicknesses (250*nt'*, 270*nt'*) for the first and the second piezoelectric neutral regions (250*n*, 270*n*), hence an increased combined piezoelectric active layer thickness. Together with a second mass loading with a decreased value as a result of a combination of the new first piezoelectric neutral region (250*n'*), the new second piezoelectric neutral region (270*n'*) and the second metal electrode (290), the increased combined piezoelectric active layer thickness effects resonance of the MDDM FBAR (300*a*) at a second resonant frequency $f_2$. When a third DC biasing voltage $V_3$ is applied, a third resonant frequency $f_3$ will be created for the MDDM FBAR.

Thus, a plurality of resonant frequencies may be achieved in the same MDDM FBAR (300*a*) by applying a plurality of DC biasing voltages in a sequential manner through the first biasing resistor (281) and the second biasing resistor (282) to obtain voltage tuning of the resonant frequency without requiring any moving parts in the FBAR. Difference between the second resonant frequency and the first resonant frequency $\Delta f=f_2-f_1$ for a given DC basing voltage difference $\Delta V_{DC}=V_2-V_1$ is determined by the first piezoelectric depletion thickness difference $\Delta 250dt=250dt'-250dt=\Delta W_n$, the second piezoelectric depletion thickness difference $\Delta 270dt=270dt'-270dt=\Delta W_p$, and the change in the mass loading.

As the magnitude for the slopes of the electric distribution curves $\xi(x, V_1)$ and $\xi(x, V_2)$ in the first piezoelectric depletion region (250*d*, 250*d'*) is proportional to the first piezoelectric layer doping concentration, whereas the magnitude for the slopes of electric distribution curves $\xi(x, V_1)$ or $(x, V_2)$ in the second piezoelectric depletion region (270, 270*d'*) is proportional to the second piezoelectric layer doping concentration, thus the first piezoelectric layer doping concentration and the second piezoelectric layer doping concentration may be preferably adjusted according to the required frequency tuning sensitivity for the surface acoustic waves in the MDDM FBAR. The tuning sensitivity for the resonant frequency of the MDDM FBAR (300*a*) is enhanced with the first piezoelectric layer doping concentration and the second piezoelectric layer doping concentration to be selected in a range of $10^{14}$ cm$^{-3}$ to $10^{21}$ cm$^{-3}$ or to be more preferably selected in the range of $10^{15}$ to $10^{20}$ cm$^{-3}$. It is noted that the distribution of doping concentration in the first piezoelectric semiconductor layer (250) and the distribution of doping concentration in the second piezoelectric semiconductor layer (270) need not to be a constant. It can be graded, stepped or have other concentration distributions.

The change in the DC biasing voltage ($\Delta V_{DC}$) causes a change in the electric field magnitude $\Delta \xi_o$, a change in the first piezoelectric depletion region width ($\Delta W_n$) and a change in the second piezoelectric depletion region width ($\Delta W_p$). The change in the DC biasing voltage ($\Delta V_{DC}$) is given as the area between the dotted electric field curve $\xi(x, V_2)$ and the solid electric field curve $\xi(x, V_1)$. The total change in the width of the depletion region ($\Delta W_n+\Delta W_p$)= $[x_n(V_2)-x_n(V_1)]+[x_p(V_2)-x_p(V_1)]=[250dt'-250dt']+ [270dt'-270dt]$. Since the depletion regions (250*d*, 270*d*) act as an combined active region for interactions between the RF signals and the mechanical acoustic vibrations in the piezoelectric layers and the thicknesses (250*dt*, 270*dt*) of the first and second piezoelectric depletion regions (250, 270) are controllable by varying the DC biasing voltage applied between (240) and (290), the resonant frequency of the MDDM FBAR (300*a*) is tuned and adjusted by the DC biasing voltage. It is noted that the distribution of doping concentration in the first piezoelectric layer (250) and in the second piezoelectric layer (270) need not be a constant. It can be graded, stepped or have other concentration distributions. A plurality of the tunable MDDM FBAR (300*a*) each with integrated biasing resistors (281) $R_1$ and (282) $R_2$ according to this invention may be combined to form a band pass filter, a switch or a power divider for microwaves or millimeter waves.

To improve thermal stability, a temperature compensation layer (295) with a temperature compensation layer thickness (295*t*) may be made of $SiO_2$ and SiON. The first passivation layer (298) may be selected from a material group of: $SiO_2$, $Si_3N_4$, SiON, $HfO_2$, and their mixtures. Materials of the bottom substrate (210) may be selected from a group including: Si, GaAs, sapphire, quartz and glass. Materials of the bottom support membrane (230) may be selected from a group including $SiO_2$, $Si_3N_4$, SiON, as long as they have sufficient mechanical strength and low enough attenuation to acoustic waves. Materials of the bottom support membrane (230) and the bottom support membrane thickness (230*t*) may also be selected to effect a temperature compensation to reduce unwanted shift of resonant frequency due to temperature fluctuation during the operation. It should be mentioned that for a first piezoelectric semiconductor layer (250) doped to have a p-type conduction, the electric field distributions should have a negative slope.

The first piezoelectric semiconductor layer (250) is selected from a material group including: AlN, GaN, AlGaN, ZnO, GaAs, AlAs, AlGaAs, as long as they are piezoelectric with sufficient acoustic coupling coefficients, are semiconducting and can be doped to p-type and/or n-type conduction. The second piezoelectric semiconductor layer (270) is also selected from a material group including: AlN, GaN, AlGaN, ZnO, GaAs, AlAs, AlGaAs, as long as they are piezoelectric with sufficient acoustic coupling coefficients, are semiconducting and can be doped to p-type and/or n-type conduction. The first piezoelectric layer thickness (250*t*) and the second piezoelectric layer thickness ($255t$) are selected in a range of 20 nm to 50 μm dependent on the acoustic wave velocity in the first piezoelectric layer, the acoustic wave velocity in the second piezoelectric layer, the first frequency $f_{o1}$ and a plurality of other resonant frequencies required for the applications.

The first metal electrode $M_1$ (240) and the second metal electrode $M_2$ (290) may have a multilayer structure. For the top layer in the first metal electrode (240) which contacts the first piezoelectric semiconductor layer $D_1$ (250), the materials is advantageously selected to have a appropriate work function so that the first metal electrode (240) forms a ohmic contact with the first piezoelectric semiconductor layer (250). Materials of the bottom layer in the second metal electrode (290) which contacts the second piezoelectric semiconductor $D_1$ (270) are advantageously selected to have a appropriate work function so that the second metal electrode (290) forms an ohmic contact with the second piezoelectric semiconductor layer (270).

When the first piezoelectric semiconductor layer (250) is n-type and the second piezoelectric semiconductor layer (270) is doped to p-type, it is preferred to have the work function of the top layer in the first metal electrode (240) to be the same as or less than the first piezoelectric semiconductor layer work function. Whereas it is preferred to have the work function of the bottom layer in the second metal electrode to be the same as or larger than that of the second piezoelectric semiconductor layer. Materials for the top layer of the first metal electrode (240) may be selected from a material group including: Ti, Al, W, Mo, Ta, Nb, Ha and their alloys, whereas materials for the rest of the first metal electrode (240) may be selected from a material group including: Mo, Al, Ti, Cu, Au and their alloys to reduce electrical resistance. Materials for the bottom layer of the second metal electrode (270) may be selected from a group including: Ni, Pt, Pd, Au and their alloys as long as the work function is large enough. Materials for the rest of the second metal electrode may be selected from a group including: Mo, Al, Ti, Cu, Au and their combinations to reduce electrical resistance.

When the first piezoelectric semiconductor layer (250) is p-type and the second piezoelectric semiconductor layer (270) is doped to n-type, it is preferred to have the work function of the top layer in the first metal electrode (240) to be the same as or larger than the first piezoelectric semiconductor layer work function. Whereas it is preferred to have the work function of the bottom layer in the second metal electrode to be the same as or less than that of the second piezoelectric semiconductor layer. Materials for the top layer of the first metal electrode (240) may be selected from group including: Ni, Pt, Pd, Au and their alloys as long the work function is large enough. Materials for the rest of the first metal electrode may be selected from a group including: Mo, Al, Ti, Cu, Au and their combinations to reduce electrical resistance. Materials for the bottom layer of the second metal electrode (290) may be selected from a group of: Ti, Al, W, Mo, Ta, Nb, Ha and their alloys. Materials for the rest of the second metal electrode may be selected from a group including: Mo, Al, Ti, Cu, Au and their combinations to reduce electrical resistance.

Materials of the first metal electrode contact (240C) may be the same as that of first metal electrode (240) and it is preferably deposited in the same deposition run with the first metal electrode (240). Whereas materials of the second metal electrode contact (290C) and the second metal electrode contact interconnect (290I) may be the same as the second metal electrode (290) and they are preferably deposited in the same deposition run with the second metal electrode (290).

Materials of the bottom substrate (210) may be selected from a group including: Si, GaAs, sapphire, quart and glass. Materials of the bottom support membrane (230) may be selected from a group including: $SiO_2$, $Si_3N_4$, SiON, as long as they have sufficient mechanical strength and low enough attenuation to acoustic waves. Materials of the bottom support membrane (230) and the bottom support membrane thickness ($230t$) may also be selected to effect a temperature compensation to reduce unwanted shift of resonant frequency due to temperature fluctuation during the operation.

In order to improve thermal stability of the device ($300a$), the temperature compensation layer (295) is included. Materials of the temperature compensation layer (295) may be $SiO_2$ or SiON. The first passivation layer (298) may be selected from a material group of: $SiO_2$, $Si_3N_4$, SiON, $HfO_2$ and their mixtures.

An $M_1D_1I_1D_2M_2$ FBAR Structure with Integrated Biasing Resistors

In order to obtain an operation frequency, the value of DC biasing voltage $V_1=V_{DC+}-V_{DC-}$ in the tunable MDDM FBAR provided in FIG. 3A may be too high for some mobile devices and the frequency tuning sensitivity may not be sufficiently precise. In order to reduce the required DC biasing voltage value and to improve the tuning sensitivity, a tunable $M_1D_1I_1D_2M_2$ FBAR or an MDIDM FBAR structure with at least one biasing resistor is provided according to another embodiment of this invention.

Figure 3C:
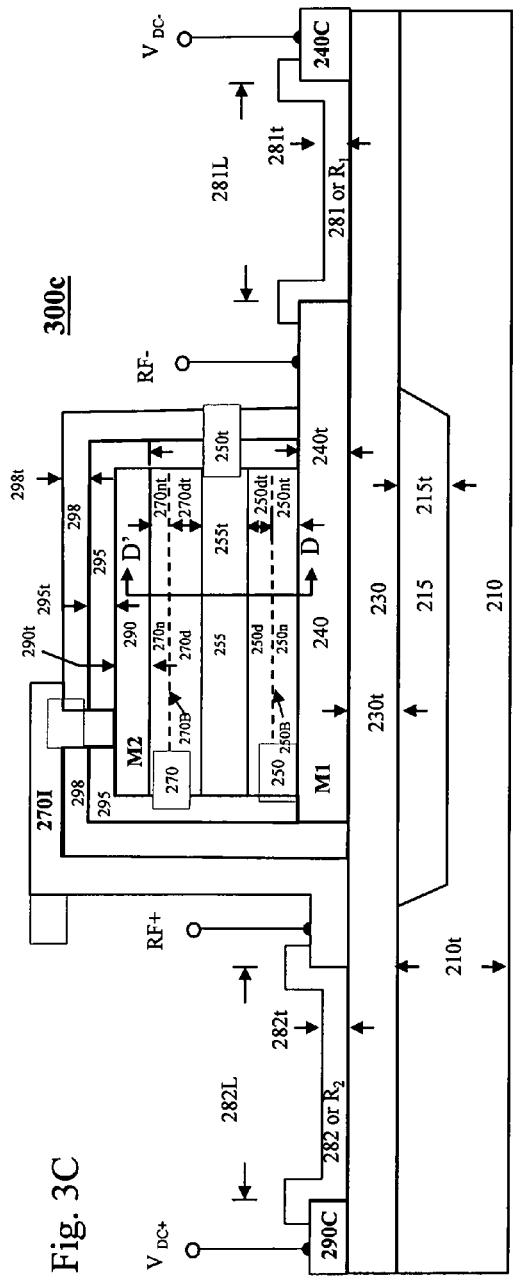
FIG. 3C is a schematic cross-sectional diagram of a frequency tunable $M_1D_1I_1D_2M_2$FBAR (300c) with integrated biasing resistors according to this invention. The MDIDM FBAR structure comprises a bottom substrate, an acoustic wave isolation region, a bottom support membrane, a first metal electrode ($M_1$), a first piezoelectric layer ($D_1$) doped to a first piezoelectric semiconducting type, a first intrinsic piezoelectric layer ($I_1$), a second piezoelectric layer ($D_2$) doped to a second piezoelectric conducting type opposite to the first piezoelectric conducting type and a second metal electrode ($M_2$). Together with the first intrinsic piezoelectric layer, a first piezoelectric depletion region in the first piezoelectric layer and a second piezoelectric depletion region in the second piezoelectric semiconductor layer form a combined piezoelectric active region for interactions between the RF signals and the mechanical acoustic vibrations.
Figure 3D:
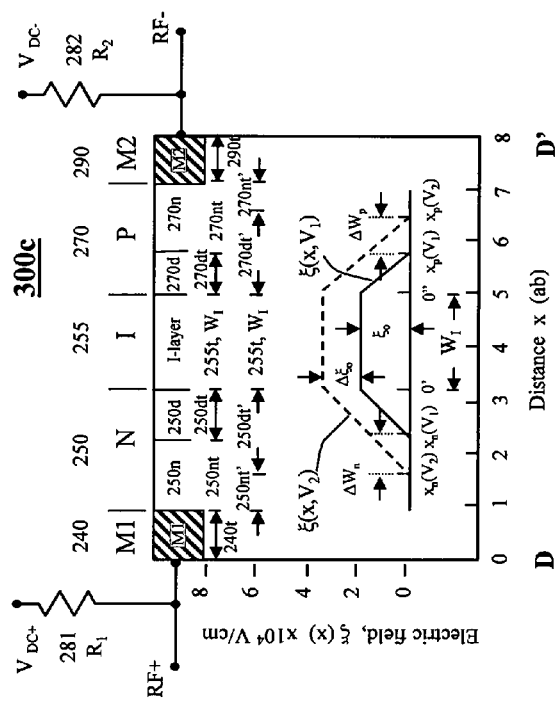
FIG. 3D shows variation of electric field magnitude $\xi(x)$ with distance along the line D-D' in the MDIDM FBAR structure shown in FIG. 3C with a DC biasing voltage applied between the first metal electrode and the second metal electrode for frequency tuning. A change in the DC biasing voltage $\Delta V_{DC}$ causes a change in the electric field in the first piezoelectric layer and the second piezoelectric layer, hence a change in the first piezoelectric depletion region thickness $\Delta W_n$ and a change in the second piezoelectric depletion region thickness $\Delta W_p$. The change in the combined piezoelectric active region thickness $\Delta W_n + \Delta W_p$ effects a change in the resonant frequency of the MDIDM FBAR.

FIG. 3C shows a schematic diagram of a portion of an $M_1D_1I_1D_2M_2$ or an MDIDM FBAR structure ($300c$) with integrated biasing resistors. Here, $M_1$ is a first metal electrode, $D_1$ is a doped first piezoelectric semiconductor layer, $I_1$ is an intrinsic first piezoelectric semiconductor layer, $D_2$ is a doped second piezoelectric semiconductor layer $D_2$, and $M_2$ is a second metal electrode.

The MDIDM FBAR structure ($300c$) comprises a bottom substrate (210) with a bottom substrate thickness ($210t$); an acoustic isolation region (215) having an acoustic isolation region thickness ($215t$); a bottom support membrane (230) with a bottom support membrane thickness ($230t$); a first metal electrode (240) with a first metal electrode thickness ($240t$); a first metal electrode contact (240C) having a first metal electrode contact thickness (240Ct) connected to a negative terminal of a DC biasing voltage source; a first piezoelectric semiconductor layer (250) with a first piezoelectric layer thickness ($250t$), a first piezoelectric layer doping type and a first piezoelectric layer doping concentration; a first intrinsic piezoelectric semiconductor layer (255) with a first intrinsic piezoelectric layer thickness ($255t$); a second piezoelectric semiconductor layer (250) with a second piezoelectric layer thickness ($250t$), a second piezoelectric layer doping type which is opposite to the first piezoelectric layer doping type and a second piezoelectric layer doping concentration; a second metal electrode (290) with a second metal electrode thickness ($290t$); a second metal electrode contact (290C) having a second metal electrode contact thickness (290Ct) connected to a positive terminal of the DC biasing voltage source; a first temperature compensation layer (295) with a first temperature compensation layer thickness ($295t$) to improve thermal stability of the FBAR; a first passivation layer (298) with a first passivation layer thickness ($298t$) and a second metal electrode interconnect (290I) with a second metal electrode interconnect thickness (290It), wherein the second metal electrode interconnect (290I) is electrically connected to the second metal electrode (290) through an opening in the first passivation layer (298) and the first temperature compensation layer (295). In (300c), the acoustic isolation region (215) may be an air cavity or a multi layer reflector having a plurality of reflector layers for acoustic wave isolation.

It should be noted that in FIG. 3C, the first metal electrode contact (240C) can also be connected to a positive terminal of the DC biasing voltage source with the second metal electrode contact (290C) connected to the negative terminal of the DC biasing voltage.

The first piezoelectric semiconductor layer (250) is a doped semiconductor which may be n-type or p-type and preferably to be n-type. The first intrinsic piezoelectric semiconductor layer (255) is not intentionally doped with a low doping concentration ($10^{13}$ cm$^{-3}$ or less) and is electrically insulating and the second piezoelectric semiconductor layer (270) is a doped semiconductor. In FIG. 3C, the first piezoelectric semiconductor layer (250) has two parts separated by a first piezoelectric depletion region edge (250B): a first piezoelectric depletion region (250d) with a first piezoelectric depletion region thickness (250dt) and a first piezoelectric neutral region (250n) with a first piezoelectric neutral region thickness (250nt). Similarly, the second piezoelectric semiconductor layer (270) also has two parts which is separated by a second piezoelectric depletion region edge (270B): a second piezoelectric depletion region (270d) with a second piezoelectric depletion region thickness (270dt) and a second piezoelectric neutral region (270n) with a second piezoelectric neutral region thickness (270nt). The first piezoelectric neutral region (250n) and the second piezoelectric neutral region (270n) are electrically conducting while the first piezoelectric depletion region (250d), the second piezoelectric depletion region (270d) and the first intrinsic piezoelectric layer (255) are intrinsic and electrically insulating. In this MIDM FBAR, the first piezoelectric depletion region (250d), the first intrinsic piezoelectric layer (255) and the second piezoelectric depletion region (270d) form a combined piezoelectric active layer to allow interactions between the RF signals and acoustic signals to take place. Since the interactions between the RF signals and acoustic signals take place mainly in the combined piezoelectric active and given that (250dt) and (270dt) are adjustable by varying the polarity or/and the magnitude of the DC biasing voltage applied between the first metal electrode (240) and the second metal electrode (290), therefore, the resonant properties and frequencies of the MDIDM FBAR structure and any filters, switches or other devices based on the semiconducting piezoelectric layers microwave acoustic effect can be tuned and adjusted by changing the polarity and/or the magnitude of the DC voltage according to this invention.

A first biasing resistor (281) with a first biasing resistor resistance value $R_1$ and a second biasing resistor (282) with a second biasing resistor resistance value $R_2$ are integrated with the MDIDM FBAR (300c) for providing a DC bias voltage and an isolation between the RF signal and the DC biasing circuit. The first biasing resistor (281) and the second biasing resistor (282) are preferably integrated thin film resistors and may have different shapes. When the first biasing resistor (281) is preferably having a rectangular shape, it has a first biasing resistor length $R_{1L}$ (281L), a first biasing resistor width $R_{1W}$ (281W, FIG. 2B), a first biasing resistor thickness $R_{1T}$ (281t) and a first biasing resistor sheet resistance $R_{\square 1}$. In the MDIDM FBAR structure (300c), the first biasing resistor (281) connects the first metal electrode (240) to the first metal electrode contact (240C), for providing a potential $V_{DC-}$ through (240C) and (281) to the first metal electrode (240 or $M_1$) and for providing isolation between the RF signals from the DC voltage source circuit. When the second biasing resistor (282) is preferably having a rectangular shape, it has a second biasing resistor length $R_{2L}$ (282L), a second biasing resistor width $R_{2W}$ (282W), a second biasing resistor thickness $R_{2T}$ (282T) and a second biasing resistor sheet resistance $R_{\square 2}$. In FIG. 3C, the second biasing resistor (282) connects the second metal electrode (290 or M2) to the second metal electrode contact (290C) through the second metal electrode interconnect (290I) for DC biasing and RF signals isolation. RF signals (RF$_+$, R$_-$) are either applied to the first metal electrode (240) and the second metal electrode interconnect (290I) or they are generated in the MDIDM FBAR (300c) and are obtained from the first metal electrode (240) and the second metal electrode interconnect (290I).

It should be pointed out that in FIG. 3C, the first metal electrode contact (240C) may also be connected to a positive terminal of the DC biasing voltage source with the second metal electrode contact (290C) connected to the negative terminal of the DC biasing voltage. According to one embodiment of the present invention, the DC biasing and the RF isolation of the MDIDM FBAR structure (300c) may be provided by using only one biasing resistor (either 281 or 282). If only the first biasing resistor (281) is used, the second metal electrode interconnect (290I) will be directly connected to the second metal electrode contact (290C). On the other hand, if only the second resistor (282) is used, the first metal electrode contact (240C) will be directly connected to the first metal electrode (240). Furthermore, a combination of a biasing resistor and a biasing inductor connected in series can as well be used to replace the first or/and the second biasing resistor to provide DC bias voltage to the MDIDM FBAR structure and an isolation between the RF signal and the DC biasing circuit.

The resistance values $R_1$ and $R_2$ of the first biasing resistor (281) and the second biasing resistor (282) are greater than 200 ohms and are preferably greater than 1,000 ohms for isolation of RF signals. The biasing resistor width $R_{1W}$ and $R_{2W}$ are not greater than the biasing resistor length $R_{1L}$ and $R_{1L}$. The biasing resistor thickness $R_{1T}$ and $R_{2T}$ are preferably less than 2 µm and are more preferably less than 0.5 µm to facilitate subsequent patterning either by etching or by lift-off. The first and the second biasing resistor sheet resistances $R_{\square 1}$ and $R_{\square 2}$ are 10 ohms/$\square$ or greater, preferably 100 ohms/$\square$ or greater to obtain biasing resistor resistance value of 1,000 ohms or greater for allowing application of DC biasing voltages with a sufficient RF isolation. However, in order to keep a small enough RC constant and to reduce unwanted switching delay time for the FBAR, the biasing resistor resistance value $R_1$ and $R_2$ should not be too large.

Materials of the thin film biasing resistors may be metals such as Ni, Cr, Ta, W, Mo, NiCr and their alloys. They may also be metal oxide and metal oxynitride such as ZnO, ZnON, InSnO, InSnON, ZnInO ZnInON, ZnSnO, ZnSnON, RuO$_2$, TaN, Bi$_2$Ru$_2$O$_7$, RuO$_2$, Bi$_2$Ir$_2$O$_7$ and other semiconductors such as Si, as long as the sheet resistance of the biasing resistors is large enough and the biasing resistors have stable thermal properties. The layer of the biasing resistors may be deposited by vacuum methods such as evaporation, DC sputtering and RF sputtering in a chamber with Ar gas or with a gas mixture of Ar, O$_2$ and/or N$_2$. According to one embodiment of this invention, the first biasing resistor (281) and the second biasing resistor (282) are fabricated in same fabrication steps, preferably with the same materials, thickness, composition, and sheet resistance on the bottom support membrane (230) or on the bottom substrate (210). They may also be fabricated in different fabrication steps and have different materials, different thickness, different composition, and different sheet resistance.

In FIG. 3C, a potential $V_{DC+}$ is provided through the second metal electrode contact (290C), the second biasing resistor (282) and the second metal electrode interconnect (290I) to the second metal electrode (290 or $M_2$). $V_{DC+}$ and $V_{DC-}$ produce a first DC biasing voltage $V_1=V_{DC+}-V_{DC-}$ between the second metal electrode (290 or M2) and the first metal electrode (240 or M1). This first DC biasing voltage $V_1$ creates the first piezoelectric depletion region (250d) in the first piezoelectric layer (250) and the second piezoelectric depletion region (270d) in the second piezoelectric layer (270) with the first piezoelectric depletion region (250d) and the second piezoelectric depletion region (270d) adjacent to the first intrinsic piezoelectric layer (255). The first DC Biasing voltage $V_1$ also controls the first piezoelectric depletion region thickness (250dt) and the second piezoelectric depletion region thickness (270dt).

FIG. 3B shows the distribution of electric field magnitude $\xi(x, V_1)$ with distance along the line D-D' in the MDIDM FBAR structure in FIG. 3C. The solid line represents the electric filed $\xi(x, V_1)$ with the first DC biasing voltage $V_1=V_{DC+}-V_{DC-}$ applied between the second metal electrode (290 or $M_2$) and the first metal electrode (240 or $M_1$) and the dotted line represents the electric filed $\xi(x, V_2)$ with a second DC biasing voltage $V_2$ applied between (290) and (240). It is noted that the maximum electrical field occurs in the first intrinsic piezoelectric semiconductor layer (255). Under the first DC biasing voltage $V_1$, the first piezoelectric depletion region (250d), the first intrinsic piezoelectric semiconductor layer (255) and the second piezoelectric depletion region (270d) together with a first mass loading due to a combination of the first piezoelectric neutral region (250n), the second piezoelectric neutral region (270n) and the second metal electrode ($M_2$, 290) yield a first resonant frequency $f_1$. When a second DC biasing voltage $V_2$ with a larger value is applied, the electric field magnitude in the first piezoelectric depletion region (250d), in the first intrinsic piezoelectric layer (255) and in the second piezoelectric depletion region (270d) increases to give new electric field distribution $\xi(x, V_2)$. This change gives rise to a new first piezoelectric depletion region (250d') with an increased first piezoelectric depletion region thickness (250dt'), a new first piezoelectric neutral region (250n') with a decreased first piezoelectric neutral region thickness (250nt'), a new second piezoelectric depletion region (270d') with an increased second piezoelectric depletion region thickness (270dt') and a new second piezoelectric neutral region (270n') with a decreased second piezoelectric neutral region thickness (270nt'). This results in increased thicknesses values for the first and second piezoelectric depletion regions (250d', 270d') and decreased thicknesses values for the first and the second piezoelectric neutral regions (250n, 270n), hence an increased combined piezoelectric active layer thickness. Together with a second mass loading with a decreased value as a result of a combination of the new first piezoelectric neutral region (250n'), the new second piezoelectric neutral region (270n') and the second metal electrode (290), the increased combined piezoelectric active layer thickness effects resonance of the MDIDM FBAR (300c) at a second resonant frequency $f_2$. When a third DC biasing voltage $V_3$ is applied, a third resonant frequency $f_3$ will be created for the MDDM FBAR.

Thus, a plurality of resonant frequencies may be achieved in same MDIDM FBAR (300c) by applying a plurality of DC biasing voltages in a sequential manner through the first biasing resistor (281) and the second biasing resistor (282) to obtain voltage tuning of the resonant frequency without requiring any moving parts in the FBAR. Difference between the second resonant frequency and the first resonant frequency $\Delta f=f_2-f_1$ for a given DC basing voltage difference $\Delta V_{DC}=V_2-V_1$ is determined by the first piezoelectric depletion thickness difference $\Delta 250dt=250dt'-250dt=\Delta W_N$, the second piezoelectric depletion thickness difference $\Delta 270dt=270dt'-270dt=\Delta W_P$, and the change in the mass loading.

A plurality of the tunable MDIDM FBAR (300c) each with integrated biasing resistors (281) $R_1$ and (282) $R_2$ according to this invention may be combined to form a band pass filter, switch, power divider for microwaves or millimeter waves.

As the magnitude for the slopes of the electric distribution curve $\xi(x, V_1)$ and $\xi(x, V_2)$ in the first piezoelectric layer depletion region (250d or 250d') is proportional to the first piezoelectric layer doping concentration, whereas the magnitude for slopes of the electric distribution curve $\xi(x, V_1)$ or $\xi(x, V_2)$ in the second piezoelectric layer depletion region (270 or 270') is proportional to the second piezoelectric layer doping concentration, thus the first piezoelectric layer doping concentration and the second piezoelectric layer doping concentration may be preferably adjusted according to the required frequency tuning sensitivity for the surface acoustic waves in the MDIDM FBAR (300c). The tuning sensitivity for the resonant frequency of the MDIDM FBAR (300c) is enhanced with the first piezoelectric layer doping concentration and the second piezoelectric layer doping concentration to be selected in a range of $10^{14}$ cm$^{-3}$ to $10^{21}$ cm$^{-3}$ or to be more preferably selected in the range of $10^{15}$ to $10^{20}$ cm$^{-3}$. It is noted that the distribution of doping concentration in the first piezoelectric semiconductor layer (250) and the distribution of doping concentration in the second piezoelectric semiconductor layer (270) need not to be a constant. It can be graded, stepped or have other concentration distributions.

The change in the DC biasing voltage ($\Delta V_{DC}$) causes a change in the electric field magnitude $\Delta \xi_o$, a change in the first piezoelectric depletion region thickness ($\Delta W_N$) and a change in the second piezoelectric depletion region thickness ($\Delta W_P$). The change in the DC biasing voltage ($\Delta V_{DC}$) causes a change in the electric field magnitude $\Delta \xi_o$ in the first intrinsic piezoelectric semiconductor layer (255) and a change in the total depletion region thickness ($\Delta W_n+\Delta W_p=[x_n(V_2)-x_n(V_1)]+[x_p(V_2)-x_p(V_1)]=[250dt'-250dt]+[270dt'-270dt]$).

Due to the existence of the first intrinsic piezoelectric semiconductor layer (255), the change in the DC biasing voltage ($\Delta V_{DC}=V_2-V_1$), given by the area between the dotted electric field magnitude curve $\xi(x, V_2)$ and solid electric field magnitude curve $\xi(x, V_1)$ is partly dropped across (255). And the area ($\Delta V_{DC}=V_2-V_1$) has three parts: one between the two horizontal lines in the first intrinsic piezoelectric semiconductor layer (255), one other between the two inclined lines in the first piezoelectric semiconductor layer (250) and the other between the two inclined lines in the second piezoelectric semiconductor layer (270). Therefore, the same DC voltage change will cause a smaller change in the thickness ($\Delta W_n+\Delta W_p$) ($\Delta W_n+\Delta W_p=[x_n(V_2)-x_n(V_1)]+[x_p(V_2)-x_p(V_1)]$ as compared to the MDDM structure (300a) shown in FIG. 3A.

Due to the low ion density in the first intrinsic piezoelectric semiconductor layer (255), the electric field $\xi_{o1}$ required to form a first piezoelectric depletion region thickness (250dt) and a second piezoelectric depletion region thickness (270dt) for achieving the desired resonant frequency could be reduced compared to that in the MDDM FBAR structure shown in FIG. 3A. Furthermore, the variation of $x_n(V)$ and $x_p(V)$ with the variation of the DC biasing voltage V would be much less with the presence of the first intrinsic piezoelectric semiconductor layer (255), hence the tuning sensitivity of the resonant frequency by the DC voltage would increase. The MDIDM FBAR structure (300c) also allows a higher doping concentration for the first piezoelectric semiconductor layer (250) and the second piezoelectric semiconductor layer (270) than that for the MDDM structure (300a).

Material of the first piezoelectric semiconductor layer (250) and the second piezoelectric semiconductor layer (270) are selected from a compound material group including: AlN, GaN, AlGaN, ZnO, GaAs, AlAs, AlGaAs as long as they are piezoelectric with sufficient acoustic-electric coupling coefficients and are semiconducting and can be doped to p-type and/or n-type conduction. Material of the first intrinsic piezoelectric layer (255) is selected from a compound material group including: AlN, GaN, AlGaN, ZnO, GaAs, AlAs, AlGaAs, LiNbO$_3$, PZT, BaTiO$_3$, quartz and KNbO$_3$ as long as they are piezoelectric with sufficiently large acoustic-electric coupling coefficients and are compatible to the first piezoelectric layer (250). The first piezoelectric layer thickness (250t) and the second piezoelectric layer thickness (270t) are selected to be in a range of 20 nm to 50 µm, dependent on the acoustic wave velocity in the first piezoelectric semiconductor layer (250) and the first frequency $f_{o1}$ of resonant and a plurality of other resonant frequencies required for the application. The first intrinsic piezoelectric layer thickness (255t) is selected in a range of 20 nm to 50 µm dependent on the acoustic wave velocity in the first intrinsic piezoelectric layer and the first frequency $f_{o1}$ and a plurality of other resonant frequencies required for the applications.

Materials of the temperature compensation layer may be selected from a group of SiO$_2$ and SiON. The first passivation layer (298) may be selected from a material group of: SiO$_2$, Si$_3$N$_4$, SiON, HfO$_2$, and their mixtures. Materials of the bottom substrate (210) may be selected from a group including: Si, GaAs, sapphire, quartz and glass and materials of the bottom support membrane (230) may be selected from a group including SiO$_2$, Si$_3$N$_4$, SiON, as long as they have sufficient mechanical strength and low enough attenuation to acoustic waves. Materials of the bottom support membrane (230) and the bottom support membrane thickness (230t) may also be selected to effect a temperature compensation to reduce unwanted shift of resonant frequency due to temperature fluctuation during the operation.

Tunable FBAR Microwave Filter Circuits

According to another embodiment of this invention, a plurality of tunable FBAR resonators are connected and biased by adjustable DC voltages for forming a FBAR filter with tunable or adjustable resonant frequencies.

FIG. 4A is a schematic diagram showing two tunable FBAR resonators (340, 350) connected to form a microwave filter circuit (400a). This filter circuit (400a) comprises a first series resonator (340) and a second parallel or shunt resonator (350) connected at a first contact point (350T); a first coupling capacitor (340C) and a second coupling capacitor (350C) for blocking DC voltages; a first isolation resistor (340R) for isolation of RF signals; and a first DC voltage source $V_{DC1}$ connected at a first source point (340ST). When the first DC voltage source $V_{DC1}$ with a voltage value $V_{1s}$ is applied between the source point (340ST) and a common point (330), a first DC voltage $V_{1s}'$ is applied across the combination of the first series resonator (340) and the second parallel resonator (350) through the first isolation resistor (340R) to establish biasing of the first series resonator (340) and the second parallel resonator (350). The bias voltage across the second resonator (350) is $V_{1s}''$ and the bias voltage across the first resonator (340) is given by $V_{1s}'-V_{1s}''$. The biasing voltages control the resonant central frequency $f_{o1}$ and effect transmission of a RF signal (360) applied to a first RF input contact (310) so that microwaves signals at and around the central frequency $f_{o1}$ and within the bandwidth of the filter circuit (400a) are allowed to propagate through the first resonator (340) to reach an RF output contact (320). The transmission central frequency $f_{o1}$ of microwaves is selected or controlled by value of the first DC voltage source $V_{DC1}$ according to this invention. A single first DC voltage source $V_{DC1}$ and a single isolation resistor is adopted in the microwave filter circuit (400a) to maintain bias for the first resonator (340) and the second resonator (350).

FIG. 4B is a schematic diagram showing two tunable TFBAR resonators (340, 350) connected to form a microwave filter circuit (400b) according to this invention. The microwave filter circuit (400b) comprises a first series resonator (340) and a second parallel or shunt resonator (350) connected at a first contact point (350T); a first coupling capacitor (340C) and a second coupling capacitor (350C) for blocking DC voltages; a first isolation resistor (340R) and a second isolation resistor (350R) for isolation of RF signals; a first DC voltage source $V_{DC1}$ connected at a first source point (340ST) and a second DC voltage source $V_{DC2}$ connected at a second source point (350ST). Two DC voltage sources are adopted in the filter circuit (400b) according to this invention to maintain biasing of the first series resonator and the second parallel resonator. When the first DC voltage source $V_{DC1}$ with a voltage value $V_{1s}$ is applied between the first source point (340ST) and a common ground point (330), the first DC voltage $V_{1s}'$ is applied through the first isolation resistor (340R) across the combination of the first series resonator (340) and second parallel resonator (350) to establish biasing of the first series resonator (340) and the second parallel resonator (350). When the second DC voltage source $V_{DC2}$ with a second voltage value $V_{2p}$ is applied between the second source point (350ST) and the common ground point (330), the second DC voltage $V_{2p}$ is applied through the second isolation resistor (350R) across the second parallel resonator (350) to establish biasing of the second parallel resonator (350). The bias voltage across the second resonator (350) is $V_{2p}'$ and the bias voltage across the first resonator (340) is given by $V_{1s}'-V_{2p}'$. The first and second DC voltage sources control the central frequency $f_{o1}$ and effect transmission of RF signal (360) applied to a first RF input contact (310) so that microwaves signal at and around the central frequency $f_{o1}$ and within the bandwidth of the filter circuit (400b) are allowed to propagate through the first series resonator (340) to reach an RF output contact (320). Central frequency $f_{o1}$ of transmission of microwaves is selected or controlled by value of the first DC voltage source $V_{DC1}$ and the second DC voltage source $V_{DC2}$. By changing the first DC voltage value $V_{1s}$ and the second DC voltage value $V_{2p}$, the biasing voltage across the first series resonator (340) and the second parallel resonator (350) can separately be controlled.

Figure 4C:
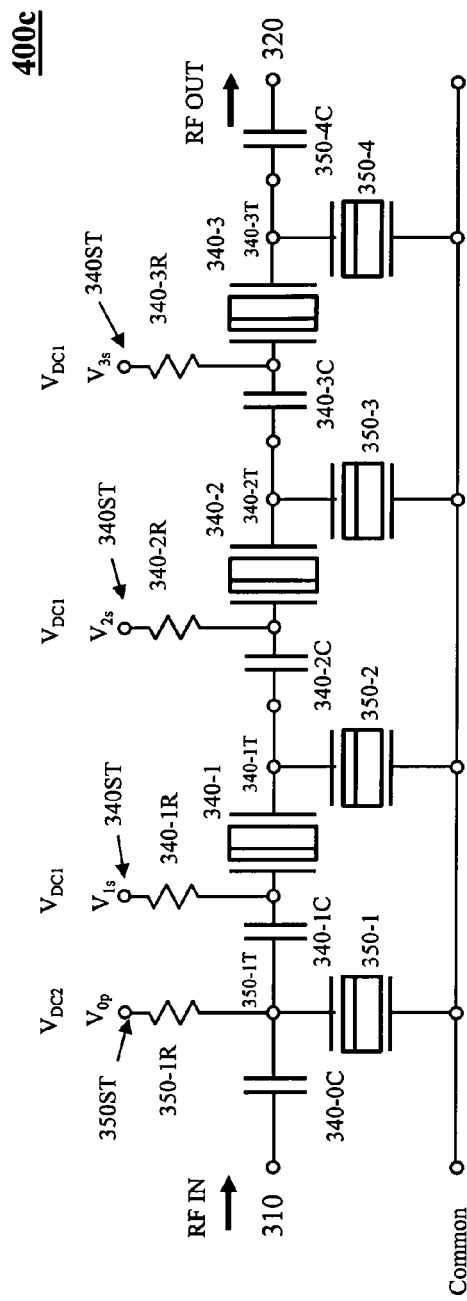
FIG. 4C shows a schematic diagram of a 3½ stage ladder tunable microwave acoustic filter (400c) according to this invention. It comprises a plurality of first series resonators, a plurality of second parallel resonators, a plurality of first coupling capacitors, a second coupling capacitor, a plurality of first isolation resistors and a second isolation resistor. A first DC voltage source $V_{DC1}$ is applied to establish biasing to the resonators and to control central frequency $f_{o1}$ of the filter.

FIG. 4C shows a schematic diagram of a 3½ stage ladder filter (400c) for microwaves according to this invention. The 3½ stage ladder filter (400c) comprises first series resonators (340-1, 340-2, 340-3); second parallel resonators (350-1, 350-2, 350-3, 350-4), first coupling capacitors (340-0C, 340-1C, 340-2C, 340-3C) and a second coupling capacitor (350-4C) for blocking of DC voltages; first isolation resistors (340-1R, 340-2R, 340-3R) and a second isolation resistor (350-1R) for isolation of RF signals; first DC voltage sources $V_{DC1}$ with a voltage value $V_{1s}$, $V_{s2}$, $V_{s2}$ connected at first source points (340ST) and a second DC voltage source $V_{DC2}$ with a voltage value $V_{0p}$) connected at a second source point (350ST). The first DC voltage sources $V_{DC1}$ could be three separated voltage sources with different voltage values $V_{1s}$, $V_{s2}$, $V_{s2}$ (i.e. $V_{1s} \neq V_{s2} \neq V_{s2}$) or with the same voltage value (i.e. $V_{1s} = V_{s2} = V_{s2}$). The first DC voltage sources $V_{DC1}$ could also be a single DC voltage source $V_{DC1}$ with a voltage value of $V_{1s}$ or $V_{s2}$, or $V_{s2}$. In the 3½ stage ladder filter (400c), each pair of the series resonator and the parallel resonator is connected at a first contact point (340-1T, 340-2T, 340-3T) and the second parallel resonator (350-1) is connected to the first coupling capacitor (340-0C) and the second isolation resistor (350-1R) at a second contact point (350-1T). The first DC voltage source $V_{DC1}$ with voltage values $V_{1s}$, $V_{2s}$, $V_{3s}$ is applied through the first isolation resistors (340-1R, 340-2R, 340-3R) across the combination of the first series resonators (340-1, 340-2, 340-3) and the second parallel resonators (350-2, 350-3, 350-4) to establish biasing of the first series resonators (340-1, 340-2, 340-3) and the second parallel resonators (350-2, 350-3, 350-4). The second DC voltage source $V_{DC2}$ with a voltage of $V_{0p}$ is applied to the second parallel resonator (350-1) through the second isolation resistor (350-1R) to establish biasing to (350-1). The biasing voltages control the central frequency $f_{o1}$ of the 3½ stage ladder filter and effect transmission of a RF signal (360) applied to a first RF input contact (310) so that microwaves signals at and around the central frequency $f_{o1}$ and within the bandwidth of the filter are allowed to propagate through the first resonators (340-1, 340-2, 340-3) to reach an RF output contact (320). The transmission central frequency $f_{o1}$ is selected or controlled by adjusting values of the first DC voltage sources $V_{DC1}$ and values of second DC voltage source $V_{DC2}$ according to this invention. Additional inductors may be added between each second parallel resonator and the Common ground.

Figure 4D:
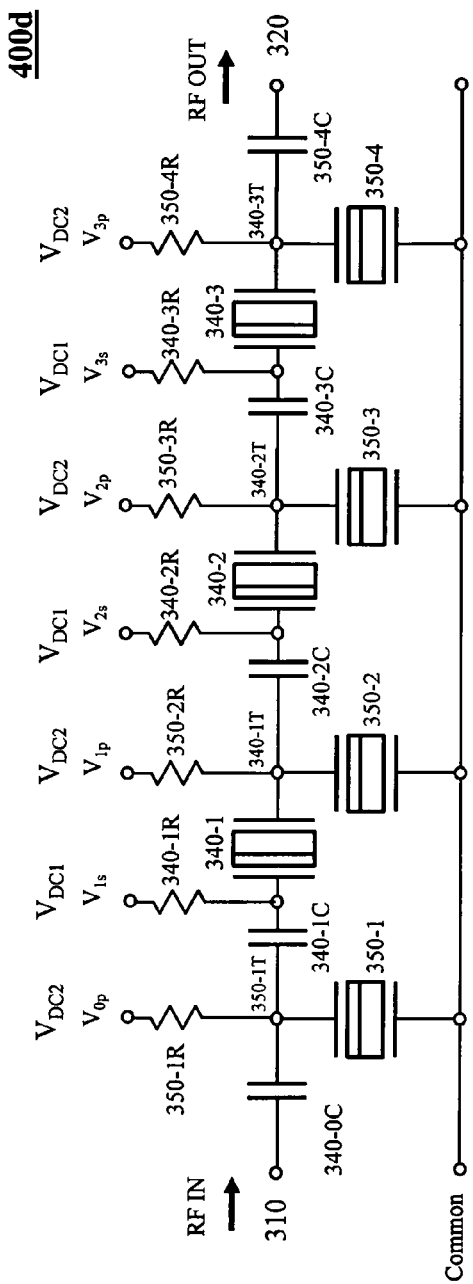
FIG. 4D shows a schematic diagram of a 3½ stage tunable ladder microwave acoustic filter (400d) according to this invention. It comprises a plurality of first series resonators, a plurality of second parallel resonators or shunt resonators, a plurality of first coupling capacitors, a second coupling capacitor, a plurality of first isolation resistors and a plurality of second isolation resistors. A first DC voltage source $V_{DC1}$ and a second DC voltage source $V_{DC2}$ are used to establish biasing to the resonators and to control the central frequency $f_{o1}$ of transmission the filter.

FIG. 4D is a schematic diagram of a 3½ stage ladder filter (400d) microwaves according to this invention. The stage ladder filter (400d) comprises first series resonators (340-1, 340-2, 340-3); second parallel resonators (350-1, 350-2, 350-3, 350-4); first coupling capacitors (340-0C, 340-1C, 340-2C, 340-3C) and a second coupling capacitor (350-4C) for blocking DC voltages; first isolation resistors (340-1R, 340-2R, 340-3R) and second isolation resistors (350-1R, 350-2R, 350-3R, 350-4R) for isolation of RF signals; first DC voltage sources $V_{DC1}$ with voltage values of $V_{1s}$, $V_{2s}$, $V_{3s}$ and second DC voltage sources $V_{DC2}$ with voltage values of $V_{0p}$, $V_{1p}$, $V_{2p}$, $V_{3p}$. In the stage ladder filter (400d), each pair of the series resonator and the parallel resonator is connected at a first contact point (340-1T, 340-2T, 340-3T) and the second parallel resonator (350-1) is connected to the first coupling capacitor (340-0C) and the second isolation resistor (350-1R) at a second contact point (350-1T). The first DC voltage sources $V_{DC1}$ with voltage values $V_{1s}$, $V_{2s}$, $V_{3s}$ are applied through the first isolation resistors (340-1R, 340-2R, 340-3R) across the combination of the first series resonators (340-1, 340-2, 340-3) and the second parallel resonators (350-2, 350-3, 350-4) to establish biasing of the first series resonators (340-1, 340-2, 340-3) and the second parallel resonators (350-2, 350-3, 350-4). The second DC voltage sources $V_{DC2}$ with voltage values of $V_{0p}$, $V_{1p}$, $V_{2p}$, $V_{3p}$ are applied to the second parallel resonators (350-1, 350-2, 350-3, 350-4) through second isolation resistors (350-1R, 350-2R, 350-3R, 350-4R) to establish biasing to each of the parallel resonators (350-1, 350-2, 350-3, 350-4). The biasing voltages control the central frequency $f_{o1}$ and effect transmission of a RF signal (360) applied to a first RF input contact (310) so that microwaves signals at and around the central frequency $f_{o1}$ and within the bandwidth of the filter (400d) are allowed to propagate through the first series resonators (340-1, 340-2, 340-3) to reach an RF output contact (320). Central frequency $f_{o1}$ of transmission of the microwaves is selected or controlled by adjusting values of the first DC voltage sources $V_{DC1}$ and values of the second DC voltage sources $V_{DC2}$ according to this invention. Additional inductors may be added between each second parallel resonator and the common ground.

What is claimed is:

1. A frequency tunable film bulk acoustic resonator FBAR with an MDM structure and integrated biasing resistors for microwave and millimeter waves comprises:
   a bottom substrate with a bottom substrate thickness;
   an acoustic isolation region having an acoustic isolation region thickness;
   a bottom support membrane having a bottom support membrane thickness;
   a first metal electrode with a first metal electrode thickness;
   a first metal electrode contact having a first metal electrode contact thickness connected to one terminal of a DC biasing voltage source;
   a first piezoelectric semiconductor layer with a first piezoelectric layer thickness, a first piezoelectric layer doping type and a first piezoelectric layer doping concentration;
   a second metal electrode with a second metal electrode thickness;
   a second metal electrode contact having a second metal electrode contact thickness connected to another terminal of said DC biasing voltage source;
   a first passivation layer with a first passivation layer thickness;
   a second metal electrode interconnect having a second metal electrode interconnect thickness, said second metal electrode interconnect is electrically connected to said second metal electrode through an opening in said first passivation layer; and
   a first biasing resistor with a first biasing resistor resistance value and a second biasing resistor with a second biasing resistor resistance value, wherein said first biasing resistor connects said first metal electrode to said first metal electrode contact and said second biasing resistor connects said second metal electrode interconnect to said second metal electrode contact to effect a DC biasing voltage having a polarity and a value between said first metal electrode and said second metal electrode and to isolate RF signals from said DC biasing voltage source,
   said DC biasing voltage creates a first piezoelectric depletion region with a first piezoelectric depletion region thickness and a first piezoelectric neutral region with a first piezoelectric neutral region thickness in said first piezoelectric semiconductor layer and forms a piezoelectric active layer to effect interactions between said RF signals and mechanical vibrations, wherein said first piezoelectric depletion region thickness is controlled by said polarity and value of said DC biasing voltage, a change in said DC biasing voltage causes a change in said first piezoelectric depletion region thickness and a change in mass loading associated with said first piezoelectric neutral region and hence effect a change in resonant frequency of said MDM FBAR.

2. A frequency tunable FBAR with an MDM structure and integrated biasing resistors for microwave and millimeter waves as defined in claim 1, wherein said first biasing resistor resistance value and second biasing resistor resistance value are preferably larger than 200 ohms and are more preferably larger than 1000 ohms.

3. A frequency tunable FBAR with an MDM structure and integrated biasing resistors for microwave and millimeter waves as defined in claim 1, wherein said first biasing resistor and second biasing resistor are thin film resistors fabricated to form an integrated tunable FBAR with said first piezoelectric semiconductor layer.

4. A frequency tunable FBAR with an MDM structure and integrated biasing resistors for microwave and millimeter waves as defined in claim 1, wherein materials of said first biasing resistor and second biasing resistor are selected from a group comprising: metals, metal alloys, metal oxides, metal nitrides, metal oxynitrides and their combinations.

5. A frequency tunable FBAR with an MDM structure and integrated biasing resistors for microwave and millimeter waves as defined in claim 1, further comprising a first intrinsic piezoelectric semiconductor layer with a first intrinsic piezoelectric layer thickness deposited between said first metal electrode and said first piezoelectric semiconductor layer to reduce said DC biasing voltage value and increase tuning sensitivity of said resonant frequency, forming a frequency tunable FBAR with an MIDM structure, wherein said first intrinsic piezoelectric semiconductor layer is selected from a compound material group including: AlN, GaN, AlGaN, ZnO, GaAs, AlAs, AlGaAs, LiNbO$_3$, PZT, BaTiO$_3$, quartz and KNbO$_3$.

6. A frequency tunable FBAR with an MDM structure and integrated biasing resistors for microwave and millimeter waves as defined in claim 1, further comprising a first intrinsic piezoelectric semiconductor layer with a first intrinsic piezoelectric layer thickness deposited between said second metal electrode and said first piezoelectric semiconductor layer to reduce said DC biasing voltage value and increase tuning sensitivity of said resonant frequency, forming a frequency tunable FBAR with an MDIM structure, wherein said first intrinsic piezoelectric layer is selected from a compound material group including: AlN, GaN, AlGaN, ZnO, GaAs, AlAs, AlGaAs, LiNbO$_3$, PZT, BaTiO$_3$, quartz and KNbO$_3$.

7. A frequency tunable FBAR with an MDM structure and integrated biasing resistors for microwave and millimeter waves as defined in claim 1, wherein materials of said bottom support membrane and bottom support membrane thickness are selected to effect a temperature compensation to reduce unwanted shift of resonant frequency during operations.

8. A frequency tunable FBAR with an MDM structure and integrated biasing resistors for microwave and millimeter waves as defined in claim 1, wherein material of said first piezoelectric layer is selected from a group including: AlN, GaN, AlGaN, ZnO, GaAs, AlAs, and AlGaAs.

9. A frequency tunable FBAR with an MDM structure and integrated biasing resistors for microwave and millimeter waves as defined in claim 1, wherein material of said substrate is selected from a groups including: Si, GaAs, glass, sapphire, AlN, Al$_2$O$_3$ as long as it has sufficiently high electrical resistivity, sufficient thermal conductivity and flat surfaces.

10. A frequency tunable FBAR with an MDM structure and integrated biasing resistors for microwave and millimeter waves as defined in claim 1, wherein said first piezoelectric layer doping concentration is controlled to be in the range of $10^{14}$ to $10^{21}$ to enhance tuning sensitivity for said resonant frequency of said FBAR.

11. A frequency tunable film bulk acoustic resonator FBAR with an MDDM structure and integrated biasing resistors for microwave and millimeter waves comprises:

a bottom substrate with a bottom substrate thickness;

an acoustic isolation region having an acoustic isolation region thickness;

a bottom support membrane having a bottom support membrane thickness;

a first metal electrode with a first metal electrode thickness;

a first metal electrode contact having a first metal electrode contact thickness connected to one terminal of a DC biasing voltage source;

a first piezoelectric semiconductor layer with a first piezoelectric layer thickness, a first piezoelectric layer doping type and a first piezoelectric layer doping concentration;

a second piezoelectric semiconductor layer with a second piezoelectric layer thickness, a second piezoelectric doping type opposite to said first piezoelectric layer doping type, and a second piezoelectric layer doping concentration;

a second metal electrode with a second metal electrode thickness;

a second metal electrode contact with a second metal electrode contact thickness connected to another terminal of said DC biasing voltage source;

a first passivation layer with a first passivation layer thickness;

a second metal electrode interconnect having a second metal electrode interconnect thickness, said second metal electrode interconnect is electrically connected to said second metal electrode through an opening in said first passivation layer; and a first biasing resistor with a first biasing resistor resistance value and a second biasing resistor with a second biasing resistor resistance value, wherein said firs biasing resistor connects said first metal electrode to said first metal electrode contact and said second biasing resistor connects said second metal electrode interconnect to second metal electrode contact to effect a DC biasing voltage having a polarity and a value between said first metal electrode and said second metal electrode and to isolate RF signals from said DC biasing voltage source, said DC biasing voltage creates a first piezoelectric depletion region with a first piezoelectric depletion region thickness and a first piezoelectric neutral region with a first piezoelectric neutral region thickness in said first piezoelectric semiconductor layer and a second piezoelectric depletion region with a second piezoelectric depletion region thickness and a second piezoelectric neutral region with a second piezoelectric neutral region thickness in said second piezoelectric semiconductor layer and form a piezoelectric active layer to effect interactions between said RF signals and mechanical vibrations, wherein said first piezoelectric depletion region thickness and said second piezoelectric depletion region thickness are controlled by said polarity and value of said DC biasing voltage, a change in said DC biasing voltage causes a change in said first and said second piezoelectric depletion region thicknesses and a change in mass loading associated with said first and second piezoelectric neutral regions and hence effect a change in resonant frequency of said MDDM FBAR.

12. A frequency tunable FBAR with an MDDM structure and integrated biasing resistors for microwave and millimeter waves in claim 11, wherein said first biasing resistor resistance value and second biasing resistor resistance value are preferably larger than 200 ohms and are more preferably larger than 1000 ohms.

13. A frequency tunable FBAR with an MDDM structure and integrated biasing resistors for microwave and millimeter waves in claim 11, wherein of said first biasing resistor and second biasing resistor are thin film resistors fabricated to form an integrated tunable FBAR with said first piezoelectric semiconductor layer and said second piezoelectric semiconductor layer.

14. A frequency tunable FBAR with an MDDM structure and integrated biasing resistors for microwave and millimeter waves in claim 11, wherein materials of said first biasing resistor and second biasing resistor are selected from a group comprising: metals, metal alloys, metal oxides, metal nitrides, metal oxynitrides and their combinations.

15. A frequency tunable FBAR with an MDDM structure and integrated biasing resistors for microwave and millimeter waves in claim 11, further comprising a first intrinsic piezoelectric semiconductor layer with a first intrinsic piezoelectric layer thickness deposited between said first piezoelectric semiconductor layer and said second piezoelectric semiconductor layer to reduce said DC biasing voltage value and increase tuning sensitivity of said resonant frequency, forming an MDIDM FBAR structure, wherein said first intrinsic piezoelectric semiconductor layer is selected from a compound material group including: AlN, GaN, AlGaN, ZnO, GaAs, AlAs, AlGaAs, LiNbO$_3$, PZT, BaTiO$_3$, quartz and KNbO$_3$.

16. A frequency tunable FBAR with an MDDM structure and integrated biasing resistors for microwave and millimeter waves in claim 11, wherein material of said bottom support membrane and bottom support membrane thickness are selected to effect a temperature compensation to reduce unwanted shift of resonant frequency during operations.

17. A frequency tunable FBAR with an MDDM structure and integrated biasing resistors for microwave and millimeter waves in claim 11, wherein materials of said first piezoelectric semiconductor layer and said second piezoelectric semiconductor layer are selected from a group including: AlN, GaN, AlGaN, ZnO, GaAs, AlAs, and AlGaAs.

18. A frequency tunable FBAR with an MDDM structure and integrated biasing resistors for microwave and millimeter waves in claim 11, wherein material of said substrate is selected from a groups including: Si, GaAs, glass, sapphire, AlN, Al$_2$O$_3$ as long as it has sufficiently high electrical resistivity, sufficient thermal conductivity and flat surfaces.

19. A frequency tunable FBAR with an MDDM structure and integrated biasing resistors for microwave and millimeter waves as defined in claim 1, whereas said first piezoelectric layer doping concentration and said second piezoelectric layer doping concentration are controlled to be in the range of $10^{14}$ to $10^{21}$ to enhance tuning sensitivity of said resonant frequency of said MDDM FBAR.

20. A microwave FBAR filter with tunable central frequency of resonance and transmission comprises,
   at least one first series tunable FBAR resonator;
   at least one second parallel tunable FBAR resonator, each pair connected at a first contact point;
   at least a first coupling capacitor and at least a second coupling capacitor for blocking of a DC voltage;
   at least a first isolation resistor for blocking of RF signals;
   at least a first DC voltage source $V_{DC1}$ with a voltage value $V_{1s}$ applied through said first isolation resistor and across the combination of said first series resonator and second parallel resonator to establish biasing for said first series resonator and second parallel resonator and to control and adjust central frequency of resonant and transmission in said FBAR filter so that RF signals applied to a first RF input contact at and around said central frequency of resonant are allowed to propagate through said first resonators to reach an RF output contact hence central frequency of resonance and transmission in said tunable microwave FBAR filter is selected and controlled to a desired value by said first DC voltage source.

21. A microwave FBAR filter with tunable central frequency of resonance as defined in claim 20, further comprising at least a second isolation resistor for isolation of RF signals and a second DC voltage $V_{DC2}$ sources connected to said second isolation resistor, said first DC voltage $V_{DC1}$ and said second DC voltage $V_{DC2}$ are adjusted so that central frequency of resonance and transmission in said tunable FBAR filter is selected and controlled to a desired value by said first DC voltage $V_{DC1}$ and said second DC voltage $V_{DC2}$.

* * * * *